United States Patent
Cao et al.

(10) Patent No.: US 7,586,171 B2
(45) Date of Patent: Sep. 8, 2009

(54) ORGANIC ELECTRONIC DEVICE COMPRISING CONDUCTIVE MEMBERS AND PROCESSES FOR FORMING AND USING THE ORGANIC ELECTRONIC DEVICE

(76) Inventors: Yong Cao, 436 Pomona Ct., Goleta, CA (US) 93117; Zhining Chen, 7620 Cathedral Oaks, Apt#3, Goleta, CA (US) 93117; Runguang Sun, 475 Tacheng Road, Bldg. 23, Apt. 102, Jiading District, Shanghai (CN) 201800; Jian Wang, 175 Kinman Ave., Apt. 3, Goleta, CA (US) 93117; Gang Yu, 667 Camino Campana, Santa Barbara, CA (US) 93111

( * ) Notice: Subject to any disclaimer, the term of this patent is extended or adjusted under 35 U.S.C. 154(b) by 35 days.

(21) Appl. No.: 11/025,265

(22) Filed: Dec. 29, 2004

(65) Prior Publication Data
US 2005/0230678 A1 Oct. 20, 2005

Related U.S. Application Data

(60) Provisional application No. 60/562,192, filed on Apr. 14, 2004.

(51) Int. Cl.
*H01L 31/00* (2006.01)
*H01L 33/00* (2006.01)
(52) U.S. Cl. .......................................... 257/448; 257/98
(58) Field of Classification Search ................... 257/91, 257/E33.063, E33.064, E33.065, E31.126, 257/98, 99, 448
See application file for complete search history.

(56) References Cited

U.S. PATENT DOCUMENTS

| | | | |
|---|---|---|---|
| 5,844,363 A * | 12/1998 | Gu et al. ...................... | 313/506 |
| 6,261,740 B1 | 7/2001 | Nguyen et al. | |
| 6,441,395 B1 * | 8/2002 | Yu et al. ........................ | 257/40 |
| 6,864,352 B2 * | 3/2005 | Wang et al. .................. | 528/423 |
| 2002/0104995 A1 * | 8/2002 | Yamazaki et al. .............. | 257/72 |
| 2003/0082889 A1 * | 5/2003 | Maruyama et al. .......... | 438/455 |
| 2003/0160247 A1 * | 8/2003 | Miyazawa .................... | 257/79 |
| 2004/0113873 A1 * | 6/2004 | Shirasaki et al. .............. | 345/76 |

(Continued)

FOREIGN PATENT DOCUMENTS

WO WO 2004/051703 A2 6/2004

OTHER PUBLICATIONS

U.S. Appl. No. 11/025,110, filed Dec. 29, 2004, Yu et al.

*Primary Examiner*—David S Blum
(74) *Attorney, Agent, or Firm*—John H. Lamming

(57) ABSTRACT

An organic electronic device includes electronic components within an array. In one embodiment, the organic electronic device includes a substrate and a first conductive member overlying the substrate and lying at least partly within the array. The first conductive member is at least part of a first power transmission line. The organic electronic device further includes a second conductive member overlying the substrate and lying at least partly within the array. The second conductive member is at least part of a first electrode and is electrically connected to the first conductive member. In another embodiment, an organic active layer has at least a portion lying between the first and second conductive members. In yet another embodiment, a process for using an organic electronic device including an array of radiation-emitting components allows radiation to be emitted from the array at an intensity of at least 1100 cd/m$^2$.

20 Claims, 11 Drawing Sheets

U.S. PATENT DOCUMENTS

2004/0145304 A1    7/2004  Choi et al.
2004/0214038 A1*  10/2004  Kwong et al. ............... 428/690
2006/0210704 A1*   9/2006  Kimura et al. ................ 427/66

* cited by examiner

ORGANIC ELECTRONIC DEVICE COMPRISING CONDUCTIVE MEMBERS AND PROCESSES FOR FORMING AND USING THE ORGANIC ELECTRONIC DEVICE

This application claims priority to Provisional Application No. 60/562,192 filed Apr. 14, 2004.

BACKGROUND OF THE INVENTION

1. Field of the Invention

The invention relates generally to organic electronic devices, and more particularly to organic electronic devices comprising conductive members and processes for forming and using the organic electronic devices.

2. Description of the Related Art

Electronic devices, including organic electronic devices, continue to be more extensively used in everyday life. Examples of organic electronic devices include Organic Light-Emitting Diodes ("OLEDs"). The electrodes of the OLEDs closest to the user of organic electronic devices are usually made of a transparent material, such as indium tin oxide ("ITO"), indium zirconium oxide ("IZO"), conducting polymers, etc. For large size display panels with high pixel counts or high radiation intensity emission applications, such material becomes impractical due to high resistance along a conductive member (e.g., anode electrodes). ITO, IZO and other transparent conducting materials are also brittle and susceptible to cracking or breaking when flexed, making their use with flexible substrates difficult.

Other materials with lower resistivities, such as gold and platinum, can be used as semi-transparent electrodes; however, the thickness of these material are limited to usually around 20 nm in order to allow sufficient transmission of radiation. Such a thin metal layer has resistance that is too high similar to the other materials previously described. Although the line resistance reduces with increasing thickness of the metal layer, the transmittance of radiation through the layer drops becomes unacceptable and the electrode becomes substantially opaque. Using a thick metal layer as part of an electrode is not a valid option, as it does not allow sufficient radiation to be transmitted through it.

SUMMARY OF THE INVENTION

An organic electronic device includes electronic components within an array. In one embodiment, the organic electronic device includes a substrate and a first conductive member overlying the substrate and lying at least partly within the array. The first conductive member is at least part of a first power transmission line. The organic electronic device further includes a second conductive member overlying the substrate and lying at least partly within the array. The second conductive member is at least part of a first electrode and is electrically connected to the first conductive member. The second conductive member has at least a portion that overlies or underlies substantially all of a radiation-emitting or radiation-responsive region of at least one of the electronic components within the array. The first conductive member does not have a portion that overlies or underlies substantially all of the radiation-emitting or radiation-responsive region for any electronic component within the array.

In another embodiment, an organic electronic device includes a substrate having a primary surface, and a first conductive member overlying the substrate. From a cross-sectional view, a first line is defined by a first point and a second point. The first point lies at an intersection of a side of the first conductive member and a first surface of the first conductive member lying closest to the substrate. The second point lies at (i) an intersection of the side of the first conductive member and a second surface opposite the first surface of the first conductive member lying farthest from the substrate or (ii) an apex of the second surface of the first conductive member. The first line intersects the primary surface at a first angle no greater than approximately 75°. The organic electronic device also includes a second conductive member overlying the substrate and spaced-apart from the first conductive member. From a cross-sectional view, a second line is defined by a third point and a fourth point. The third point lies at an intersection of a side of the second conductive member and a first surface of the second conductive member lying closest to the substrate. The fourth point lies at (i) an intersection of the side of the second conductive member and a second surface opposite the first surface of the second conductive member lying farthest from the substrate or (ii) an apex of the second surface of the second conductive member. The second line intersects the primary surface at a second angle no greater than 75°. The organic electronic device further includes an organic active layer having at least a portion lying between the first and second conductive members.

In still another embodiment, a process for forming an organic electronic device includes forming a first conductive member and a second conductive member overlying a substrate that has a primary surface. The first conductive member and the second conductive member are space-apart from each other. From a cross-sectional view, a first line is defined by a first point and a second point. The first point lies at an intersection of a side of the first conductive member and a first surface of the first conductive member lying closest to the substrate. The second point lies at (i) an intersection of the side of the first conductive member and a second surface opposite the first surface of the first conductive member lying farthest from the substrate or (ii) an apex of the second surface of the first conductive member. The first line intersects the primary surface at an angle no greater than approximately 75°. From a cross-sectional view, a second line is defined by a third point and a fourth point. The third point lies at an intersection of a side of the second conductive member and a first surface of the second conductive member lying closest to the substrate. The fourth point lies at (i) an intersection of the side of the second conductive member and a second surface opposite the first surface of the second conductive member lying farthest from the substrate or (ii) an apex of the second surface of the second conductive member. The second line intersects the primary surface at an angle no greater than 75°. The process also includes forming an organic active layer having at least a portion lying between the first and second conductive members.

In yet another embodiment, a process is used for an organic electronic device including an array of radiation-emitting components. The process includes placing a first electrode at a first voltage, wherein at least one of the radiation-emitting components within the array includes the first electrode. The process also includes placing a second electrode at a second voltage, wherein the at least one of the radiation-emitting components includes the second electrode. During placing the first electrode at the first voltage and placing the second electrode at the second voltage, radiation is emitted from the array at an intensity of at least 1100 cd/m$^2$.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
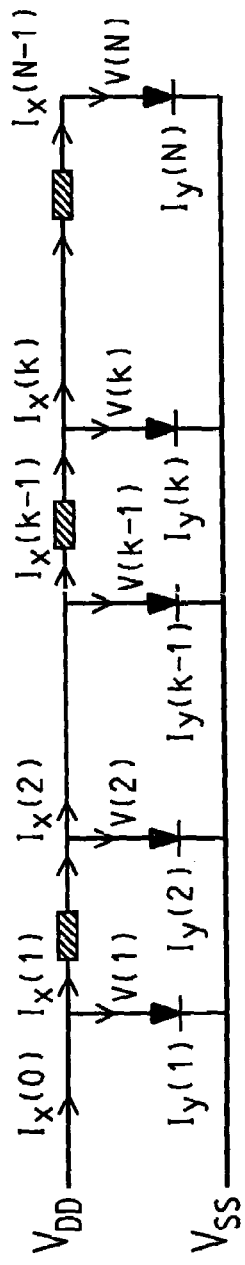
FIG. 1 includes an illustration of a circuit diagram depicting voltages and currents at different locations along a part of a row or column of pixels.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An organic electronic device includes electronic components within an array, wherein the organic electronic device includes a substrate and a first conductive member overlying the substrate and lying at least partly within the array. The first conductive member is at least part of a first power transmission line. The organic electronic device further includes a second conductive member overlying the substrate and lying at least partly within the array. The second conductive member is at least part of a first electrode and is electrically connected to the first conductive member. The second conductive member has at least a portion that overlies or underlies substantially all of a radiation-emitting or radiation-responsive region of at least one of the electronic components within the array. The first conductive member does not have a portion that overlies or underlies substantially all of the radiation-emitting or radiation-responsive region for any electronic component within the array.

In another embodiment, the first conductive member includes a metal and the second conductive member includes an organic material. In still another embodiment, the first conductive member includes a first material, and the second conductive member includes a second material different from the first material. The second material has a resistivity at least ten times higher than the first material. In yet another embodiment, the organic electronic device further includes a buffer layer, a charge-blocking layer, a charge-injection layer, a charge-transport layer, or a combination thereof, wherein the first conductive member includes a first metal and the second conductive member includes a second metal different from the first metal.

In a further embodiment, the first conductive member includes a window portion. From a plan view of the array, the window portion surrounds the radiation-emitting or radiation-receiving region of at least one electronic component within the array. In still a further embodiment, the organic electronic device is designed to be an outdoor display or a lighting panel. In yet a further embodiment, the organic electronic device further includes third conductive members substantially identical to the second conductive member and electrically connected to the first power transmission line, wherein the second and third conductive members are spaced apart from one another. In a specific embodiment, the first power transmission line extends across substantially all of a dimension of the array.

In another embodiment, the organic electronic device further includes an organic active layer. In a specific embodiment, the organic electronic device further includes third conductive members substantially identical to the first conductive member. The third conductive members are at least part of a second power transmission line. From a plan view, the first and second power transmission lines are substantially parallel to one another within the array. In a more specific embodiment, each of the first and third conductive members lies closer to the substrate compared to the organic active layer. In another specific embodiment, the organic electronic device further includes a lid, wherein each of the first and third conductive members lies closer to the lid compared to the organic active layer. In another embodiment, the first member is shaped as a lattice.

In one embodiment, an organic electronic device includes a substrate having a primary surface, and a first conductive member overlying the substrate. From a cross-sectional view, a first line is defined by a first point and a second point. The first point lies at an intersection of a side of the first conductive member and a first surface of the first conductive member lying closest to the substrate. The second point lies at (i) an intersection of the side of the first conductive member and a second surface opposite the first surface of the first conductive member lying farthest from the substrate or (ii) an apex of the second surface of the first conductive member. The first line intersects the primary surface at a first angle no greater than approximately 75°. The organic electronic device also includes a second conductive member overlying the substrate and spaced-apart from the first conductive member. From a cross-sectional view, a second line is defined by a third point and a fourth point. The third point lies at an intersection of a side of the second conductive member and a first surface of the second conductive member lying closest to the substrate. The fourth point lies at (i) an intersection of the side of the second conductive member and a second surface opposite the first surface of the second conductive member lying farthest from the substrate or (ii) an apex of the second surface of the second conductive member. The second line intersects the primary surface at a second angle no greater than 75°. The organic electronic device further includes an organic active layer having at least a portion lying between the first and second conductive members.

In another embodiment, the organic electronic device further includes third conductive members that are spaced apart from each other, lie between the first conductive member and the second conductive member, and are electrically connected to the first conductive member. In a specific embodiment, the third conductive members and portions of the organic active layer are parts of radiation-emitting components. In another specific embodiment, the first conductive member is a first power transmission line, and the second conductive member is a second power transmission line. In still another specific embodiment, a black layer lies between the substrate and substantially all of each of the first and second conductive members but does not lie between the substrate and any of the third conductive members except those portions, if any, of the third conductive members that also overlie the first conductive member.

In one embodiment, a process for forming an organic electronic device includes forming a first conductive member and a second conductive member overlying a substrate that has a primary surface. The first conductive member and the second conductive member are space-apart from each other. From a cross-sectional view, a first line is defined by a first point and a second point. The first point lies at an intersection of a side of the first conductive member and a first surface of the first conductive member lying closest to the substrate. The second point lies at (i) an intersection of the side of the first conductive member and a second surface opposite the first surface of the first conductive member lying farthest from the substrate or (ii) an apex of the second surface of the first conductive member. The first line intersects the primary surface at an angle no greater than approximately 75°. From a cross-sectional view, a second line is defined by a third point and a fourth point. The third point lies at an intersection of a side of the second conductive member and a first surface of the second conductive member lying closest to the substrate. The fourth point lies at (i) an intersection of the side of the second conductive member and a second surface opposite the first surface of the second conductive member lying farthest from the substrate or (ii) an apex of the second surface of the second conductive member. The second line intersects the primary surface at an angle no greater than 75°. The process also includes forming an organic active layer having at least a portion lying between the first and second conductive members.

In another embodiment, forming the first and second conductive members includes forming a patterned layer over at least one part, but not all, of the substrate, wherein the patterned layer has a characteristic selected from hydrophilic and hydrophobic. Forming the first and second conductive members also includes applying a conductive liquid layer over the substrate. If the characteristic is hydrophilic, the conductive liquid layer is formed over the patterned layer, and if the characteristic is hydrophobic, the conductive liquid layer is formed over at least one portion of the substrate that is not covered by the patterned layer. The first and second conductive members include at least a conductive material from the conductive liquid layer.

In still anther embodiment, forming the first and second conductive members includes forming a patterned layer over at least part, but not all, of the substrate, wherein the patterned layer is selected from a conductor and an insulator. Forming the first and second conductive members also includes plating a conductive layer over the substrate. If the patterned layer is a conductor, the conductive layer is formed over the patterned layer, and if the patterned layer is an insulator, the conductive layer is formed over at least one portion of the substrate that is not covered by the patterned layer. The first and second conductive members include at least portions of the conductive layer.

In yet another embodiment, forming the first and second conductive members includes forming a conductive layer, forming a mask member over the conductive layer, isotropically etching the conductive layer to define the first and second conductive members, and removing the mask member. In still yet another embodiment, forming the first and second conductive members includes forming a conductive layer over a substrate, forming a mask member over the conductive layer, etching the conductive layer to define the first and second conductive members, wherein during etching, a significant portion of the mask member is etched to reduce a lateral dimension of the mask member, and removing the mask member.

In another embodiment, each of the first and second conductive members is a power transmission line extending at least across substantially all of a dimension of an array of radiation-emitting components, radiation-responsive components, or a combination thereof.

In one embodiment, a process is used for an organic electronic device including an array of radiation-emitting components. The process includes placing a first electrode at a first voltage, wherein at least one of the radiation-emitting components within the array includes the first electrode. The process also includes placing a second electrode at a second voltage, wherein the at least one of the radiation-emitting components includes the second electrode. During placing the first electrode at the first voltage and placing the second electrode at the second voltage, radiation is emitted from the array at an intensity of at least 1100 cd/m$^2$.

In another embodiment, the intensity is in a range of approximately 2000 to 5000 cd/m$^2$. In still another embodiment, the organic electronic device includes a first conductive member that is at least part of a first power transmission line, wherein the first conductive member is electrically connected to the first electrode. In a specific embodiment, the first conductive member line extends across substantially all of a dimension of the array. In another specific embodiment, a significant amount of the radiation is transmitted through the first electrode but a significant amount of the radiation is not transmitted through the first conductive member.

In still another specific embodiment, the organic electronic device further includes an organic active layer overlying a substrate. In more specific embodiment, the organic electronic device further includes third conductive members substantially identical to the first conductive member. Each of the third conductive members is a second power transmission line, and from a plan view, the first and second power transmission lines are substantially parallel to one another within the array. In an even more specific embodiment, each of the first and third conductive members lies closer to the substrate compared to the organic active layer. In another even more specific embodiment, the organic electronic device further includes a lid, wherein each of the first and third conductive members lie closer to the lid compared to the organic active layer. In a further embodiment, the first member is shaped as a lattice.

Other features and advantages of the invention will be apparent from the following detailed description, and from the claims. The detailed description first addresses Definitions and Clarification of Terms followed by the Modeling Resistance, Early Fabrication Sequence Including Power Transmission Lines Adjacent to the Substrate, Fabrication After Formation of Power Transmission Lines, Electronic Operation of the Organic Electronic Device, Alternative Embodiments for Power Transmission Lines Adjacent to the Substrate, Alternative Embodiments for Power Transmission Lines Adjacent to the Lid, Other Embodiments, Advantages, and finally Examples.

1. Definitions and Clarification of Terms

Before addressing details of embodiments described below, some terms are defined or clarified. The term "apex," when referring to a substrate structure, is intended to mean, from a cross-sectional view, a point along a curved surface farthest from a reference plane (e.g., a primary surface of a substrate).

The terms "array," "peripheral circuitry" and "remote circuitry" are intended to mean different areas or components. For example, an array may include pixels, cells, or other electronic devices within an orderly arrangement (usually designated by columns and rows) within a component. These electronic devices may be controlled locally on the component by peripheral circuitry, which may lie within the same component as the array but outside the array itself. Remote circuitry typically lies away from the peripheral circuitry and can send signals to or receive signals from the array (typically via the peripheral circuitry). The remote circuitry may also perform functions unrelated to the array.

The term "black" when used to modify a layer or material depends on the location within the device and is not meant to denote or connote a specific color. The black layer or material transmits or reflects no more than approximately 10% of radiation at a targeted wavelength or spectrum.

The term "buffer layer" or "buffer material" is intended to mean one or more electrically conductive or semiconductive materials and may have one or more functions in an electronic device, including planarization of the underlying layer, a charge transport or charge injection property, scavenging of one or more impurities, such as oxygen or metal ions, or another aspect to facilitate or to improve the performance of the electronic device. A buffer material may be a polymer, a solution, a dispersion, a suspension, an emulsion, a colloidal mixture, another composition, or any combination thereof.

The term "charge-blocking," when referring to a layer, material, member, or structure, is intended to mean such layer, material, member or structure significantly reduces the likelihood that a charge migrates into another layer, material, member or structure.

The term "charge-injecting," when referring to a layer, material, member, or structure, is intended to mean such layer, material, member or structure promotes charge migration into an adjacent layer, material, member or structure.

The term "charge transport," when referring to a layer or material, is intended to mean such layer or material that can receive a charge from an electrode and facilitates movement of such charge through the thickness of such layer or material with relative efficiency and small loss of charge.

The terms "conductive" is intended to mean a property of a layer, material, member, or structure, wherein current can flow through such layer, material, member, or structure without a substantial drop in potential.

The term "coterminous" is intended to mean that, from a cross-sectional view, at least one side of a layer, member, or structure is substantially in line with at least one side of another layer, member, or structure.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductor laser, an optical switch, or the like. An electronic component does not include parasitic resistance (e.g., resistance of a wire) or parasitic capacitance (e.g., capacitive coupling between two conductors connected to different electronic components where a capacitor between the conductors is unintended or incidental).

The term "hydrophilic" is intended to mean that an edge of a liquid exhibits a wetting angle less than 90 degrees with respect to a surface that it contacts.

The term "hydrophobic" is intended to mean that an edge of a liquid exhibits a wetting angle of 90 degrees or more with respect to a surface that it contacts.

The term "isotropic etch" is intended to mean an etch that occurs substantially equally in vertical and horizontal directions from a cross-sectional view of a substrate. The term "anisotropic etch" is intended to mean an etch that occurs at a significantly higher rate in a one direction compared to another direction when etching the same material. Although no etch is entirely isotropic or anisotropic, etches tend to be significantly more isotropic or anisotropic compared to the other (of anisotropic or isotropic).

The term "lateral dimension" is intended to mean a dimension as seen from a plan view or a top view of a reference plane, such as a primary surface of a substrate.

The term "lattice" is intended to mean a structure having intersecting members in one or more repeating patterns.

The term "lighting panel" is intended to mean a radiation-emitting device having a principal function of illuminating a room or other area of at least 10 square feet.

The term "liquid layer" is intended to mean one or more layers that are initially placed on a surface while in a liquid state.

The term "organic active layer" is intended to mean one or more organic layers, wherein at least one of the organic layers, by itself, or when in contact with a dissimilar material is capable of forming a rectifying junction.

The term "organic electronic device" is intended to mean a device including one or more organic conductor or organic semiconductor layers or organic materials. An organic electronic device includes: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

The term "outdoors" is intended to mean a location where ambient light varies significantly with the intensity of sunlight or a lack thereof. Note that in addition to being outside of a building, outdoors may also include the interior of a domed stadium having transparent or translucent panels within the dome, as the ambient light level within such domed stadium will vary significantly with the weather, time of day, or both. An outdoor display is a display intended for use outdoors.

The term "overlying" does not necessarily mean that a layer, member, or structure is immediately next to or in contact with another layer, member, or structure. For example, a first structure overlies a second structure when the first structure lies above a second structure. The first structure may or may not contact the second structure.

The term "power transmission line" is intended to mean a conductive member that is: (i) connected to a plurality of components, (ii) capable of carrying a relatively higher current for a longer period of time without failing compared to at least some of the other conductive members connected to it, and (iii) from a plan view, has a length that is at least ten times longer than its width. For the purposes of this specification, a power transmission line can withstand a current density of $2 \times 10^9$ A/m$^2$ at an ambient temperature of 25° C. for a time period of 5 years without failing.

The term "primary surface" is intended to mean a surface of a substrate from which an electronic device is subsequently formed.

The term "radiation-emitting" is intended to mean an electronic component or a region thereof, which when such electronic component is properly biased, emits radiation from the region at a targeted wavelength or spectrum of wavelengths. The radiation may be within the visible-light spectrum or outside the visible-light spectrum (ultraviolet ("UV") or IR). A light-emitting diode is an example of a radiation-emitting component.

The term "radiation-responsive" is intended to mean an electronic component or a region thereof that can sense or respond to radiation received by such region at a targeted wavelength or spectrum of wavelengths. The radiation may be within the visible-light spectrum or outside the visible-light spectrum (UV or IR). Photodetectors, IR sensors, biosensors, and photovoltaic cells are examples of radiation-responsive components.

The term "rectifying junction" is intended to mean a junction within a semiconductor layer or a junction formed by an interface between a semiconductor layer and a dissimilar material, in which charge carriers of one type flow easier in one direction through the junction compared to the opposite direction. A pn junction is an example of a rectifying junction that can be used as a diode.

The phrase "X is selected from A, B, and C" is equivalent to the phrase "X is selected from the group consisting of A, B, and C", and is intended to mean that X is A, or X is B, or X is C. The phrase "X is selected from 1 through n" is intended to mean that X is 1, or X is 2, . . . or X is n.

The term "semiconductor" is intended to mean a material that is capable of including or having a rectifying junction formed therein or when such material is in contact with a dissimilar material (e.g., a metal-containing material).

The term "substrate" is intended to mean a base material that can be either rigid or flexible and may be include one or more layers of one or more materials, which can include glass, polymer, metal or ceramic materials or any combination thereof.

The term "window" is intended to mean an opening within a structure through which radiation is designed to pass.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Group numbers corresponding to columns within the periodic table of the elements use the "New Notation" convention as seen in the *CRC Handbook of Chemistry and Physics*, 81$^{st}$ Edition (2000).

Unless otherwise defined, all technical and scientific terms used herein have the same meaning as commonly understood by one of ordinary skill in the art to which this invention belongs. Although suitable methods and materials are described herein for embodiments of the invention, or methods for making or using the same, other methods and materials similar or equivalent to those described can be used without departing from the scope of the invention. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, and semiconductor arts.

2. Modeling Resistance

A conductive member along a series of diodes (e.g., a row or column) can be modeled by the circuit illustrated in FIG. 1. The upper line in FIG. 1 represents the conductive member. The voltage at the left-hand side of the inorganic conductive member as illustrated in FIG. 1 is set at $V_{DD}$. Because the resistance of the conductive member is not zero, the voltage across the length of the conductive member becomes closer to zero because of the line resistance. Therefore, the voltage becomes closer to zero as distance from the left-hand side of FIG. 1 increases. The lower line in FIG. 1 is the kept at a fixed voltage $V_{SS}$. For simplicity, the resistance along the lower line in FIG. 1 is zero because the resistance long the upper line is substantially larger than the resistance in the lower line.

The resistance along the upper line reduces potential and current provided to diodes as distance from the left-hand side of FIG. 1 increases. In one application, the diodes are OLEDs. The lower potential and current reduces the intensity of radiation emitted. Therefore, even with substantially identical OLEDs, the OLEDs closer to the left-hand size of FIG. 1 can emit radiation at a higher intensity compared to the OLEDs along the right-hand side of FIG. 1. For a single conductive member with N pixels, the equations of $I_x$, $I_y$ and V for an arbitrary pixel k are:

$$\begin{cases} I_x(k-1) - I_x(k) = I_y(k) \\ I_y(k) = C_1 V(k) \\ V(k-1) - V(k) = I_x(k-1)R_a \end{cases} \quad \text{(Equations 1)}$$

where $R_a$ is the line resistance of the conductive member between adjacent pixels.

In the above equations, $V_{SS}$ is assumed to be equal to zero volts to simplify the calculations. Also, the current-voltage (I–V) relation of the pixel is assumed to be in a linear form, and $C_1$ is a constant. Generally, the I–V relation of an OLED has a more complicated form. The boundary conditions are:

$$\begin{cases} V(k=1) = V_{DD} \\ I_x(k=N) = 0 \end{cases} \quad \text{(Equations 2)}$$

where N is the total number of the pixels. The solutions of Equations 1 subject to the above boundary conditions are:

$$\begin{cases} V(k) = \dfrac{V_0}{\cosh\left[\sqrt{C_1 R_a}\,(N-1)\right]} \cosh\left[\sqrt{C_1 R_a}\,(N-k)\right] \\ I_x(k) = \dfrac{V_0\sqrt{\dfrac{C_1}{R_a}}}{\cosh\left[\sqrt{C_1 R_a}\,(N-1)\right]} \sinh\left[\sqrt{C_1 R_a}\,(N-k)\right] \\ I_y(k) = \dfrac{C_1 V_0}{\cosh\left[\sqrt{C_1 R_a}\,(N-1)\right]} \cosh\left[\sqrt{C_1 R_a}\,(N-k)\right] \end{cases} \quad \text{(Equations 3)}$$

In the case of large N, N−1 could be approximated by N. From the above solutions, the ratio of the V(N) to V(1) is:

$$\dfrac{1}{\cosh\left[\sqrt{C_1 R_a}\,(N-1)\right]} \quad \text{(Equation 4)}$$

The above ratio can be used to determine the uniformity of radiation emission intensity along the conductive member. Embodiments described below can be used to reduce the line resistance of the conductive member to allow more uniformity of radiation emission intensity, allow larger and higher pixel count arrays to be formed, allow high intensity displays and flat panel lights to be achieved, or any combination thereof.

The prior description focused more on line resistance between the anode connections of the diodes in FIG. 1. As top emission electronic devices become more prevalent, the focused may be reversed. More specifically, one or more cathodes used in the electronic devices may need to be transparent; however, the transparency may cause the resistance of the cathode(s) to become unacceptably high. Referring to FIG. 1, the resistors would lie between the cathode connections of the diodes instead of the anode connections. Alternative embodiments can be used to reduce the line resistance between the cathode connections of the diodes.

3. Early Fabrication Sequence Including Power Transmission Lines Adjacent to the Substrate Attention is now directed to specific, non-limiting embodiments in accordance with the present invention. The embodiment as illustrated in FIGS. 2-7 may be used for making a passive matrix ("PM") OLED display. Modifications may be made for use with multi-color or full-color passive matrix and active matrix OLED displays are described later in this specification. Those displays could be segmented displays with icon sign segments, or pixelated displays with column-row electrodes or pixel electrodes. The substrates of the displays could be rigid or flexible. Further, other embodiments may be used in electronic devices that receive radiation for sensing, current generation, and potentially other applications, like flat panel lamp.

Figure 2:
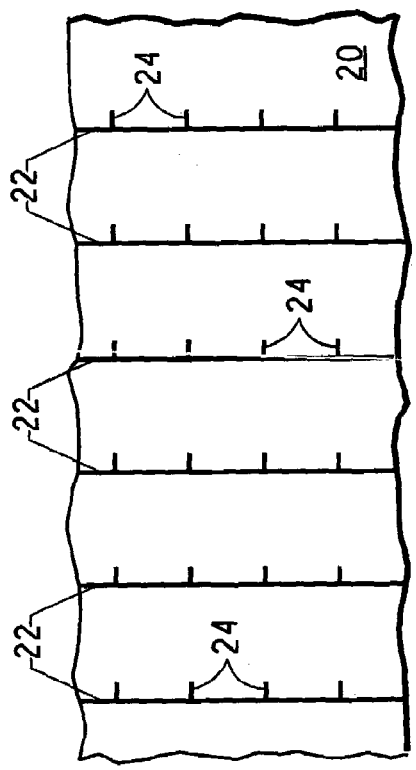
FIG. 2 includes an illustration of a plan view of a portion of an array after forming conductive members (power transmission lines).

FIG. 2 includes a plan view of a portion of a pixel array for a PM OLED display. The PM display comprises a substrate 20, which may be a conventional substrate as used in the organic electronic device arts. The substrate 20 can be flexible or rigid, organic or inorganic. Generally, glass or flexible organic films are used as a support. Pixel driver and other circuits (not illustrated) may be formed over or within the substrate 20 using conventional techniques. The focus of fabrication is on the pixel array rather than the peripheral or remote circuitry. The substrate 20 may comprise a ceramic, glass, metallic or organic material or combinations thereof and can have a thickness in a range of approximately 12 to 2500 microns.

Conductive members 22 are formed over the substrate 20. The conductive members 22 act as power transmission lines and extend at least partially across the array, and in one embodiment, extend across substantially all of a dimension (row or column) of the array. Referring to FIG. 2, the conductive members 22 may extend across substantially all of the columns of the array. The conductive members 22 include taps 24 for making electrical connections to subsequently-formed conductive members that will act as first electrodes. In this specific embodiment, the conductive members 22 are inorganic, metal-containing power transmission lines to help reduce the line resistance, so that organic electronic components along each conductive member 22 has more uniform potential and current characteristics along the length of the columns.

Because the conductive members 22 do not need to transmit radiation, they can be substantially thicker and more conductive than conventional transparent anodes, such as ITO or IZO or a very thin metal layer. The conductive members 22 may have a thickness in a range of approximately 500 nm to 500 μm. In one embodiment, the conductive members 22 may be thicker than 2000 nm, and their thicknesses may be limited to other issues unrelated to radiation (e.g., film stress, step coverage of subsequently layers over the conductive members 22, etc.).

The conductive members 22 can comprise one or more highly conductive materials including a metal, mixed metal, alloy, metal oxide, metal nitride, mixed-metal oxide, mixed-metal nitride, or a combination thereof. Exemplary metallic elements used in the conductive members 22 may include Ni, Cu, Al, Au, Ag, W, Ta, or combinations thereof. In an alternative embodiment, other conductive materials, such as conductive polymers, can be used in addition to or in place of the highly conductive materials. The length and width of the conductive members 22 may be determined by the layout of the organic electronic device. Resistivity (i.e., selection of material(s)) and thickness can be varied without significantly affecting the layout. If a material with a higher resistivity is used, the conductive members 22 may be thicker to keep the line resistance within acceptable limits. In one embodiment, at least part of the conductive members 22 can be plated. More details regarding plating are described later in this specification.

The use of conductive members 22 can make the use of flexible substrates more feasible. At least some of the materials used for conductive members 22 are ductile and malleable, and therefore, can be used with a flexible substrate without breaking. If the conductive members 22 were replaced with ITO or IZO, the ITO or IZO may be susceptible to breaking and result in an electrical open or region(s) of unacceptably high resistance.

Although not illustrated in FIG. 2, an optional black layer may underlie the conductive members 22 to improve contrast, particularly for reducing background luminescence. A nearly limitless number of materials can be used for a black layer. Its electrical characteristics can vary from conductive to semi-conductive to insulating. A potential material for a black lattice or layer can comprise one or more inorganic materials selected from elemental metals (e.g., W, Ta, Cr, In, or the like); metal alloys (e.g., Mg—Al, Li—Al, or the like); metal oxides (e.g., $Cr_xO_y$, $Fe_xOy$, $In_2O_3$, SnO, ZnO, or the like); metal alloy oxides (e.g., InSnO, AlZnO, AlSnO, or the like); metal nitrides (e.g., AlN, WN, TaN, TiN, or the like); metal alloy nitrides (e.g., TiSiN, TaSiN, or the like); metal oxynitrides (e.g., AlON, TaON, or the like); metal alloy oxynitrides; Group 14 oxides (e.g., $SiO_2$, $GeO_2$, or the like); Group 14 nitrides (e.g., $Si_3N_4$, silicon-rich $Si_3N_4$, or the like); and Group 14 oxynitrides (e.g., silicon oxynitride, silicon-rich silicon oxynitride, or the like); Group 14 materials (e.g., graphite, Si, Ge, SiC, SiGe, or the like); Group 13 to 15 semiconductor materials (e.g., GaAs, InP, GaInAs, or the like); Group 12 to 16 semiconductor materials (e.g., ZnSe, CdS, ZnSSe, CuO, or the like); any combination thereof, and the like. An elemental metal refers to a layer that consists essentially of a single element and is not a homogenous alloy with another metallic element or a molecular compound with another element. For the purposes of metal alloys, silicon is considered a metal. In many embodiments, a metal, whether as an elemental metal or as part of a molecular compound (e.g., metal oxide, metal nitride, or the like) may be a transition metal (an element within Groups 3 to 12 in the Periodic Table of the Elements) including chromium, tantalum, gold, or the like.

The black layer can include one or more high absorbance material(s) selected from polyolefins (e.g., polyethylene, polypropylene, or the like); polyesters (e.g., polyethylene terephthalate, polyethylene naphthalate or the like); polyimides; polyamides; polyacrylonitriles and polymethacrylonitriles; perfluorinated and partially fluorinated polymers (e.g., polytetrafluoroethylene, copolymers of tetrafluoroethylene and polystyrenes, and the like); polycarbonates; polyvinyl chlorides; polyurethanes; polyacrylic resins, including homopolymers and copolymers of esters of acrylic or methacrylic acids; epoxy resins; Novolac resins, organic charge transfer compounds (e.g., tetrathiafulvalene tetracyanoquinodimethane ("TTF-TCNQ") and the like), any combination thereof, and the like.

The thickness of the black layer is typically in a range of approximately 5 to 100 nm. The thickness is relatively thin and selected to keep background luminescence relatively low. A further advantage is that the black layer can act as an adhesion layer to allow a wider variety of materials to be used for the substrate 20 and conductive members 22 without having to address whether the substrate 20 and conductive members 22 will adhere well enough to each other.

In one embodiment, the conductive members 22 can have curved or sloped sidewalls as illustrated in FIGS. 3 to 6. The curved or sloped sidewall of the conductive members 22 can help to reduce the "waveguide effect." In other words, radiation emitted by an organic active layer subsequently formed between any pair of conductive members 22 may have more of its emitted radiation reflected in a direction other than sideways (i.e. parallel to the primary surface of the substrate 20), which is more likely to occur with sidewalls that form an angle of at least 85° with respect to the primary surface of the substrate 20. FIGS. 3 to 6 illustrate different ways of achieving curved or sloped sidewalls. The angles are measured at an intersection of a line and the primary surface of the substrate. The angles are typically no greater than 75°. In one embodiment, each of the angles is in a range of approximately 30 to 70°.

Figure 3:
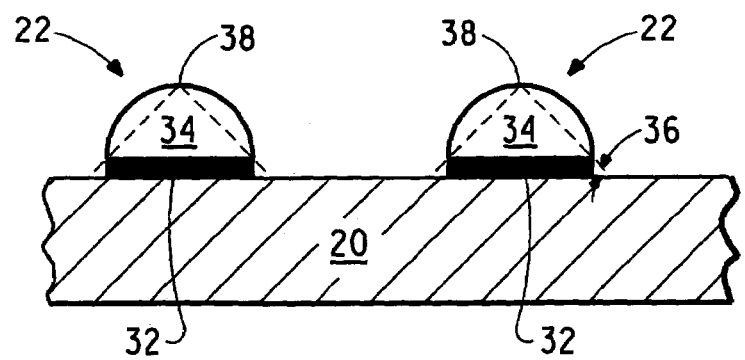
FIGS. 3 to 6 includes illustrations of cross-sectional views of the substrate of FIG. 2 for different processes for forming the power transmission lines and the resulting cross-sectional shapes.

FIG. 3 illustrates an embodiment that may form the conductive members 22 using conductive members 34 formed from a liquid conductive layer. A patterned hydrophilic layer 32 is formed over the substrate 20. In one embodiment, the patterned hydrophilic layer 32 can include an aluminosilicate or a clay and a cross-linked hydrophilic binder, which is a product of a reaction of a water-soluble binder with a hardening agent. In another embodiment, layer 32 also includes one or more colloidal silicas, amorphous slicas, surfactants, and combinations thereof. In still other embodiment, the patterned hydrophilic layer 32 could be formed by materials with pendent hydrophilic groups. The pendent hydrophilic groups may be a hydroxy, a carboxylic acid, a sulfonic acid, a carboxamide, a sulfonamide, a hydroxymethylamide, an alkoxymethylamide, an epoxy, an oxetane, an amine, or combinations thereof. For detailed information about some particular hydrophilic layers and the specific components and their corresponding ratio of the layer, refer to Patent U.S. Pat. No. 6,261,740 B1. In one embodiment, the patterned hydrophilic layer 32 has a thickness in a range of approximately 1 to 100 nm.

The patterned hydrophilic layer can be formed using one or more of any number of different techniques including a conventional coating, casting, printing (continuous printing, ink jet printing, screen printing, etc.), vapor deposition, other deposition process, or any combination thereof. The patterned hydrophilic layer 32 may be formed as a patterned layer (e.g., using a stencil mask) or by depositing the layer 32 over all the substrate 20 and using a conventional patterning sequence.

The liquid conductive layer may be formed over the patterned hydrophilic layer 32. Due to the higher surface energy of the liquid conductive layer compared to the substrate 20, the liquid conductive layer forms "drops" over of the patterned hydrophilic layer 32 and not over the other portions of the substrate 20. The liquid conductive layer can include a silver paste, nickel paste, polyaniline ("PANI"), poly(3,4-ethylenedioxythiophene) ("PEDOT"), polypyrrole, etc. and its thickness may depend on the width of the patterned hydrophilic layer 34. Typically, the liquid conductive layer has a thickness in a range of 0.2 µm to 500 µm.

After the liquid conductive layer is formed, a liquid medium within the liquid conductive layer may be evaporated or otherwise removed to leave a substantially solid layer in the form of conductive members 34. The conductive members 34, patterned hydrophilic layer 32, or both may include a black layer.

Each of the conductive members 34 has an apex 38 over the patterned hydrophilic layer 32. Dashed lines form angles 36 with respect to the primary surface of the substrate. Each of the dashed lines is defined by two points. One of the points lies at an intersection of a side of the conductive member 34 and a surface of the conductive member 34 lying closest to the substrate (i.e., the surface contacting the patterned hydrophilic layer 32. The other point for the line lies at the apex 38. In one embodiment, the angles 36 are in a range of approximately 30 to 50°.

In an alternative embodiment not illustrated, a patterned hydrophobic layer instead of or in conjunction with the patterned hydrophilic layer 32 is used. The patterned hydrophobic layer would be a mirror image of the patterned hydrophilic layer 32. The patterned hydrophobic layer has a lower surface tension compared to exposed surface the liquid conductive layer. The surface energy of the liquid may be between the surface energies of the patterned hydrophobic layer and the substrate or hydrophilic layer, if present. The liquid conductive layer would not remain over the hydrophobic layer.

After the liquid conductive layer is formed, a liquid medium within the liquid conductive layer may be evaporated or otherwise removed to leave the conductive member 34. The hydrophobic layer may or may not be removed after the conductive member 34 is formed. If the hydrophobic layer is removed, it may or may not include a black layer. However, if the hydrophobic layer is to remain over the substrate 20, it should not have a black layer and should transmit at least 70% of the radiation to be emitted or received by a subsequently-formed organic layer.

Figure 4:
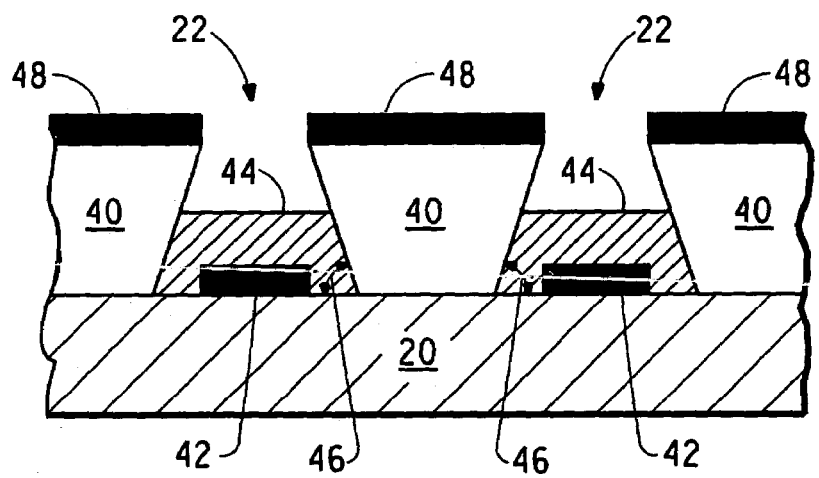

FIG. 4 illustrates an embodiment where selective plating is used. Structures 40 are formed over location where the conductive members 22 are not to be formed. Structures 40 may be formed using a conventional process used to form cathode separation structures in organic PM displays. The structures 40 have a thickness in a range of approximately 2 to 5 microns. A conductive layer can be deposited by physical vapor deposition. Portions 42 lie along the primary surface of the substrate 20, and portions 48 overlie the structures 40. The conductive layer includes a metal, mixed metal, alloy, metal oxide, metal nitride, mixed-metal oxide, mixed-metal nitride, or a combination thereof. The conductive layer typically has a thickness in a range of 0.5 μm to 500 μm. The portions 42 and 48 are electrically insulated from each other in this embodiment. If desired, a collimator may be used during the physical vapor deposition to reduce the likelihood of unintended electrical shorts between the portions 42 and 48. Portions 42 and 48 may include a black layer.

A plating apparatus and method, such as the one described in U.S. Pat. No. 6,174,425, can be used to plate a conductive layer 44 over the portions 42. The portions 42 are electrically connected to the cathode of the plating apparatus, and the portions 48 are allowed to electrically float. The conductive layer 44 is plated over the portions 42 but is not significantly plated over the portions 48 because they electrically float during plating. The conductive layer 44 can include a metal, mixed metal, alloy, metal oxide, metal nitride, mixed-metal oxide, mixed-metal nitride, or a combination thereof. Exemplary metallic elements used in the seed layer may include Ni, Cu, Au, Ag Pt, Pd, or combinations thereof. The conductive layer 44 typically has a thickness in a range of 0.5 μm to 500 μm. The portions 42, the conductive layer 44, or both may include a black layer. With respect to angles, lines used for measuring the angles can be defined by two points. One of the points lies at an intersection of a side of the conductive layer 44 and a first surface of the conductive layer 44 lying closest to the substrate 20. The other point lies at an intersection of the side of the conductive layer 44 and a second surface opposite the first surface. Each of the angles 46 is in a range of approximately 50 to 70°.

After the conductive members 22 are formed, structures 40 and portions 48 may be removed by a conventional dry or wet etching technique that is selective to the conductive layer 44 and substrate 20.

In an alternative embodiment (not illustrated), conductive members 42 are formed over the substrate 20. A patterned insulating layer may be formed after the conductive members 42 are formed. The portions 48 as seen in FIG. 4 are not formed in this embodiment. Also, the patterned insulating layer may have sloped sidewalls as illustrated in FIG. 4 or sloped in the reverse direction. When sloped in the other direction, the patterned insulating layer has features that are wider near the substrate 20 and narrower further from the substrate. Similar to the prior embodiment, selective plating may be performed. Such a structure may increase the intensity of radiation seen by a user because radiation is reflected more to the user side compared to the cathode.

Figure 5:
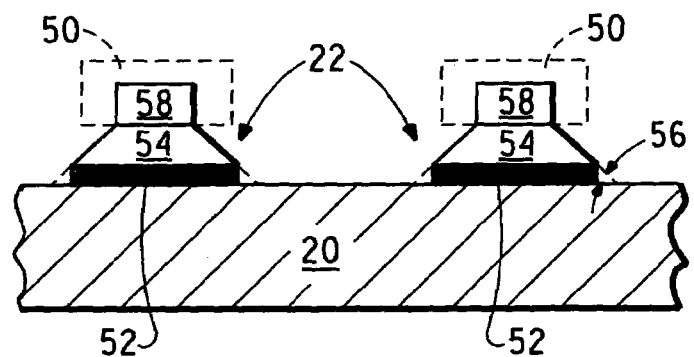

FIG. 5 illustrates an embodiment where mask erosion may be used. A black layer 52 and a conductive layer 54 may be formed over substantially all of the substrate 20. The black layer 52 and conductive layer 54 may include any of the materials and thicknesses previously described for black layers or the portions 42 and the conductive layer 44, respectively. A patterned masking layer has a mask member with an original shape 50, as formed, that lies over the conductive layer 54. The conductive layer 54 may be anisotropically etched using an appropriate etch chemistry. Such etch chemistry may include a chlorine-containing, a bromine-containing, potentially another gas, or any combination thereof. During the anisotropic etching, some oxygen may be included to erode the mask member, and thereby reduce its dimensions, including a lateral dimension. By the end of the etch, the mask member has a shape as illustrated by solid line 58.

The black layer 52 may be etched using the same or different etch chemistry. If the black layer 52 uses a different etch chemistry, the etch chemistry may be changed to a different gas (e.g., a fluorine-containing gas) and use the patterned conductive layer 54 as its mask as illustrated in FIG. 5. Because the black layer 52 is relatively thin, it may be wet etched without causing any significant complications. After the etching sequence, the mask members can be removed using a conventional technique. Lines defined by points along the sides of the conductive members 22 (i.e., remaining portion of layer 54) form angles 56 with respect to the substrate that are in a range of approximately 40 to 70°.

Figure 6:
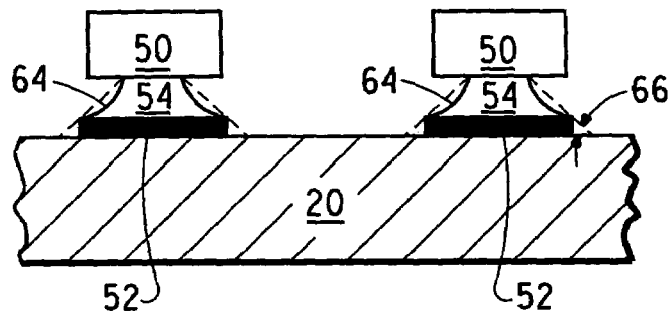
Figure 7:
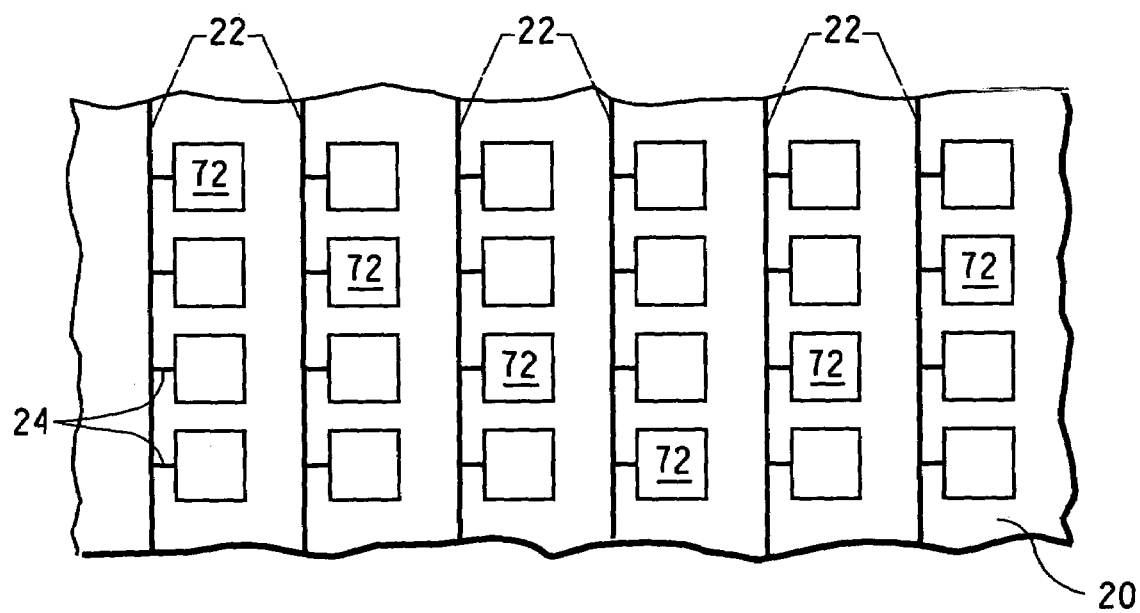
FIG. 7 to 10 include illustrations of cross-sectional views of the substrate of FIG. 5 during the rest of fabrication of an organic electronic device.

FIG. 6 illustrates an embodiment similar to the one described in FIG. 5 except the conductive layer 54 is isotropically etched and the mask erosion is not required. The isotropic etching may be performed as a wet etch or as a dry etch (e.g., downstream plasma etcher). The black layer 52 may be etched using any of the etching techniques described for the black layer 52 with respect to FIG. 5.

As can be seen in FIG. 6, the sides 64 of the conductive layer 54 are concave. The concave sides 64 are similar to the shape of reflectors seen with flashlights. After the etching sequence, the masking member 50 can be removed using a conventional technique. Lines defined by points along the sides of the conductive members 22 (i.e., remaining portions of layer 54) form angles 66 with respect to the substrate that are in a range of approximately 40 to 70°.

The conductive members 22 having curved or sloped sides may be formed by other methods. The embodiments described above are to give a sampling of just some illustrative ways to achieve the shapes and is not to be construed as comprehensive or limiting.

4. Fabrication After Formation of Power Transmission Lines

Conductive members 72 are formed over the substrate 20 and are electrically connected to and contact the conductive members 22. The conductive members 72 are first electrodes that are anodes and include one or more conductive layers. The conductive members 22 and 72 may include different materials. In one embodiment, conductive members 22 and 72 may include different metallic elements, and the resistivity of conductive member 72 may be at least ten times greater than the resistivity of conductive member 22.

The surface of the conductive members 72 furthest from the substrate 20 includes a relatively high work function material. The conductive members 72 include one or more of layers of indium tin oxide, aluminum tin oxide, or other materials conventionally used for anodes within organic electronic devices. In this embodiment, the conductive members 72 transmit at least 70% of the radiation to be emitted from or received by a subsequently-formed organic layer. In one embodiment, the thickness of the conductive members 72 is in a range of approximately 100 to 200 nm. The materials and thicknesses of the conductive members 72 are typical of those used for transparent anodes as used in OLEDs. Unlike conductive members 72, conductive members 22 do not transmit a significant amount of radiation of that is to be emitted or received by a subsequently-formed organic layer. In this embodiment, conductive members 72 do not include a black layer, and a black layer may only lie between the substrate 20 and portions of the conductive members 72 where such portions overlie the conductive members 22 (power transmission lines).

The conductive members 72 are formed using one or more of any number of different techniques including a conventional coating, casting, printing (continuous printing, ink jet printing, screen printing, etc.), vapor deposition, other deposition process, or any combination thereof. The conductive members 72 may be formed as a patterned layer (e.g., using a stencil mask) or by depositing the layer(s) over all the substrate 20 and using a conventional patterning sequence.

In this embodiment, the conductive members 72 are substantially identical to and spaced apart from one another and electrically connected to the conductive members 22. The shapes of the conductive members 72 are in the shape of rectangles and correspond to pixels within an array. In an alternative embodiment, nearly any shape may be used, such as circles, triangles, pentagons, other regular or irregular shapes (trapezoids, rhombuses, etc.), or any combination thereof. The shapes may be the same or different sizes. In still another embodiment, the conductive members 72 could be in the form of strips, where the lengths of the strips are substantially parallel to the lengths of the conductive members 22. The pixels are defined by the intersections of the conductive strips and subsequently-formed second electrodes. In still another embodiment (not illustrated), the conductive members 72 may be oriented, such that from a plan view, the conductive members 22 bisect the conductive members 72 (i.e., different portions, which may or may not be equal in size, of conductive members 72 lies on each side of the conductive members 22). In such an embodiment, taps 24 are not required for making electrical contact.

Figure 8:
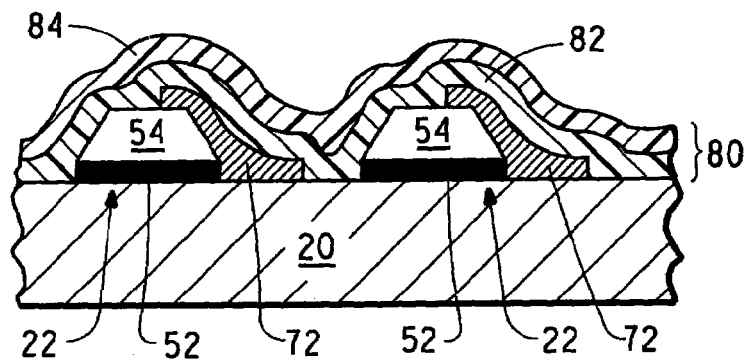
Figure 9:
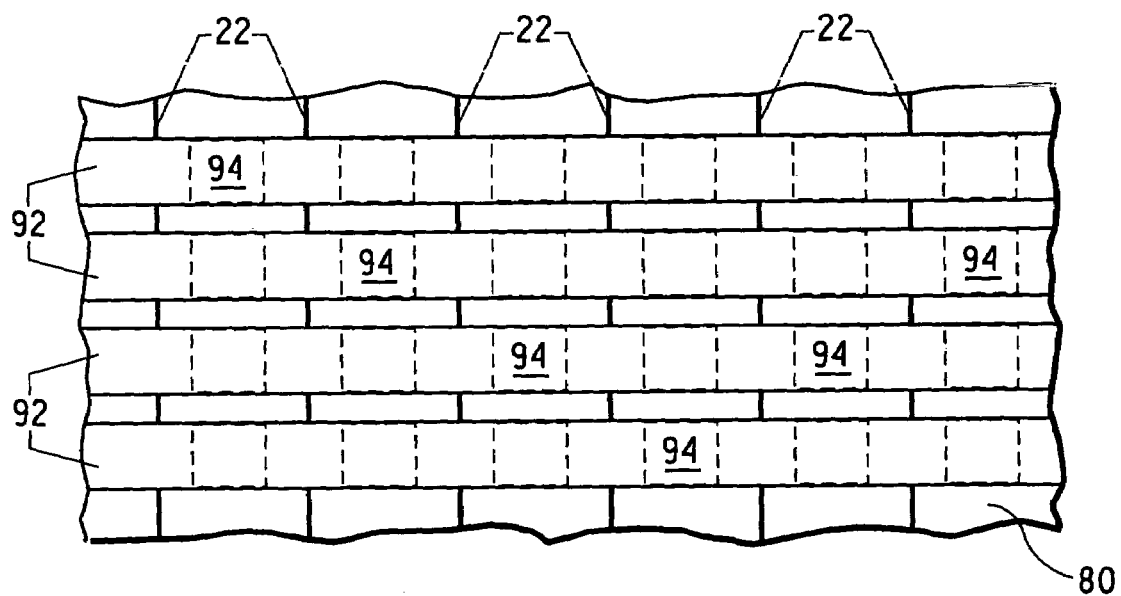
Figure 10:
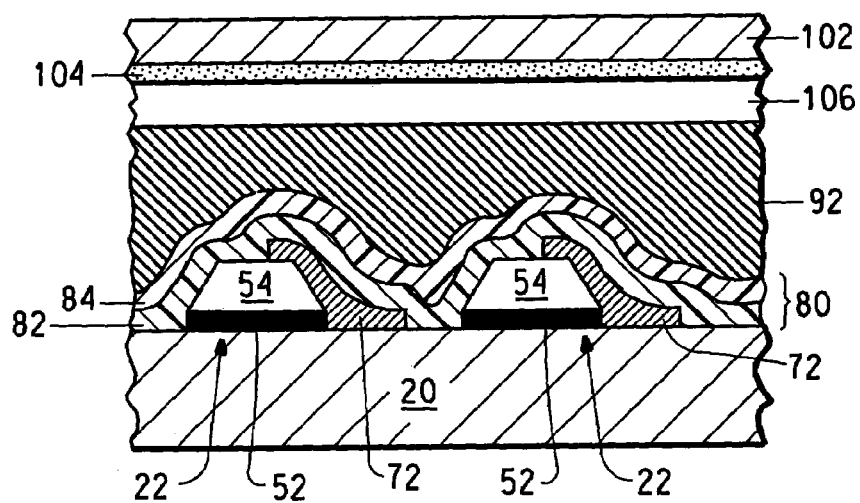

An organic layer 80 may be formed as illustrated in FIG. 8. The organic layer 80 may include one or more layers. For example, the organic layer 80 may include a charge-transport layer 82 and an organic active layer 84, or the organic active layer 84 without the charge-transport layer 82. Note that charge-transport layer 82 may alternatively overlie the organic active layer 84. When the charge-transport layer 82 lies between the conductive members 72 and the organic active layer 84, the charge-transport layer 82 will be a hole-transport layer, and when the charge-transport layer lies between the organic active layer 84 and subsequently-formed conductive members that act as second electrode(s) (i.e., cathodes), the charge-transport layer will be an electron-transport layer. In another embodiment, charge-transport layers may lie on both sides of the organic active layer 84. In another embodiment, a buffer layer, a charge-blocking layer, a charge-injection layer, or both may be used in place of or in conjunction with the charge-transport layer. Similar to the charge-transport layer, either or both of the charge-blocking layer and charge-injection layer may lie along either or both sides of the organic active layer 84. The embodiment as illustrated in FIG. 9 has the charge-transport layer 82 that acts as the hole-transport layer.

The charge-transport layer 82 and the organic active layer 84 are formed sequentially over the conductive members 72. Each of the charge-transport layer 82 and the organic active layer 84 can be formed by using one or more of any number of different techniques including a conventional coating, casting, printing (ink jet printing, screen printing, etc.), vapor deposition, other deposition process, or any combination thereof. One or both of the charge-transport layer 82 and the organic active layer 84 may be cured after application.

When the charge-transport layer 82 acts as a hole-transport layer, it may include one or more of PANI, PEDOT, polypyrrole, or material(s) conventionally used as hole-transport layers as used in organic electronic devices. The hole-transport layer typically has a thickness in a range of approximately 100 to 250 nm.

In an embodiment not illustrated, the charge-transport layer 82 may be and patterned to have a shape, when seen from a plan view, similar to the conductive members 72. Therefore, in such an embodiment, conductive members include a conductive or semiconductor layer (i.e., charge-transport layer 82) lying between an electrode (e.g., conductive members 72, anodes) and the organic active layer 84. In another embodiment, the charge-transport layer 82 can be a buffer layer, replaced by a buffer layer, or used in conjunction with a buffer layer. In one embodiment, the buffer layer includes an electrically conducting polymer and facilitates the injection of holes from the anode into the EL material layer. Typical conducting polymers employed as buffer layers include sulfonated versions of PANI, PEDOT, polypyrrole, or any combination thereof.

The composition of the organic active layer 84 typically depends upon the application of the organic electronic device. The organic active layer 84 can include material(s) as conventionally used as organic active layers in organic electronic devices and can include one or more small molecule materials, one or more polymer materials, or any combination thereof. After reading this specification, skilled artisans will be capable of selecting appropriate material(s), layer(s) or both for the organic active layer 84. In one embodiment, each of the organic active layer 84 has a thickness in a range of approximately 50 to 500 nm.

Although not illustrated, an optional charge-transport layer that acts as electron-transport layer may be formed over the organic active layer 84 The optional charge-transport layer may include at least one of aluminum tris(8-hydroxyquinoline) or other material conventionally used as electron-transport layers in organic electronic devices. The optional charge-transport layer can be formed by spin coating, casting, printing or vapor depositing appropriate materials as described below. The electron-transport layer typically has a thickness in a range of approximately 30 to 500 nm. If a hole-blocking layer, an electron-injection layer, or both were to be formed, they would be formed after the organic active layer 84 and before forming a second electrode.

In an alternative embodiment, the organic layer 80 may include a single layer with a composition that varies with thickness. For example, the composition nearest the conductive members 72 may act as a hole transporter, the next composition may act as an organic active layer, and the composition furthest from the conductive members 72 may act as an electron transporter. One or more materials may be present throughout the entire thickness of the organic layer.

Portions of the organic layer 80, if any, that lie outside the array may be removed. Typically, conductive leads to peripheral circuitry, remote circuitry, or both may become exposed. Also, the "rail" (location where a subsequently-formed lid is attached to the substrate 20) may be cleared of the organic layer 80. Note in this embodiment that the pattern of the organic layer 80 does not have sides that are not substantially coterminous with the sides of the conductive members 72 as seen from a plan view.

Conductive members 92, which are second electrodes, are formed over the organic layer 80 as illustrated in FIG. 9. With respect to the conductive members 72, the conductive members 92 act as cathodes. The surface of the conductive members 92 closest to the organic layer 80 includes a relatively low work function material. The conductive members 92 includes one or more of a Group 1 metal, Group 2 metal, or other materials conventionally used for cathodes within organic electronic devices. In one embodiment, one or more metal layers (e.g., Al, Au, Cu, etc.) are formed over the Group 1 metal, Group 2 metal, or other material. Regions 94, illustrated by dashed lines, are regions where radiation is to be emitted or received by the organic layer 80. In this embodiment, regions 94 are those portions of the organic active layer 84 lying between the conductive members 22 and 92 and correspond to the pixels of the array.

The conductive members 92 may be formed using one or more of any number of different techniques including a conventional coating, casting, printing (continuous printing, ink jet printing, screen printing, etc.), vapor deposition, other deposition process, or any combination thereof. The conductive members 92 may be formed as a patterned layer (e.g., using a stencil mask) or by depositing the layer(s) over all of the array and using a conventional patterning sequence. The conductive members 92 have a thickness in a range of approximately 100 to 2000 nm.

Other circuitry not illustrated in FIG. 9 may be formed using any number of the previously described or additional layers. Although not illustrated, additional insulating layer(s) and interconnect level(s) may be formed to allow for circuitry in peripheral areas (not illustrated) that may lie outside the array. Such circuitry may include row or column decoders, strobes (e.g., row array strobe, column array strobe), or sense amplifiers.

A lid 102 with a desiccant 104 is attached to the substrate 20 at locations outside the array to form a substantially completed device. A gap 106 lies between the second electrode 1000 and the desiccant 104. The materials used for the lid 102 and desiccant 104 and the attaching process are conventional.

5. Electronic Operation of the Organic Electronic Device

During operation of a display or flat panel light, appropriate potentials are placed on the conductive members 22 and 92 to cause radiation to be emitted from the organic active layer 84. More specifically, when radiation is to be emitted, signals applied to conductive members 22 and 92, so that the difference in potential between the conductive members 22 and 92 sufficiently forward biases the radiation-emitting component(s) and allow electron-hole pairs combine within the organic active layer 84, so that light or other radiation may be emitted from the organic electronic device. In a display, rows and columns can be given signals to activate the appropriate pixels (electronic devices) to render a display to a viewer in a human-understandable form.

If the organic electronic device includes radiation sensors within the array, radiation-sensing components may be reversed biased at a predetermined potential (e.g., conductive member 92 has a potential approximately 5 to 15 volts higher than the conductive member 72). If radiation at the targeted wavelength or spectrum of wavelengths is received by the organic layer 80, the number of carriers (i.e., electron-hole pairs) within the organic layer 80 increases and causes an increase in current as sensed by sense amplifiers within the peripheral circuitry outside the array.

In a photovoltaic cell, light or other radiation can be converted to energy that can flow without an external energy source. The conductive members 22 and 92 may be connected to a battery (to be charged) or an electrical load. After reading this specification, skilled artisans are capable of designing the electronic devices, peripheral circuitry, and potentially remote circuitry to best suit their particular needs.

Figure 11:
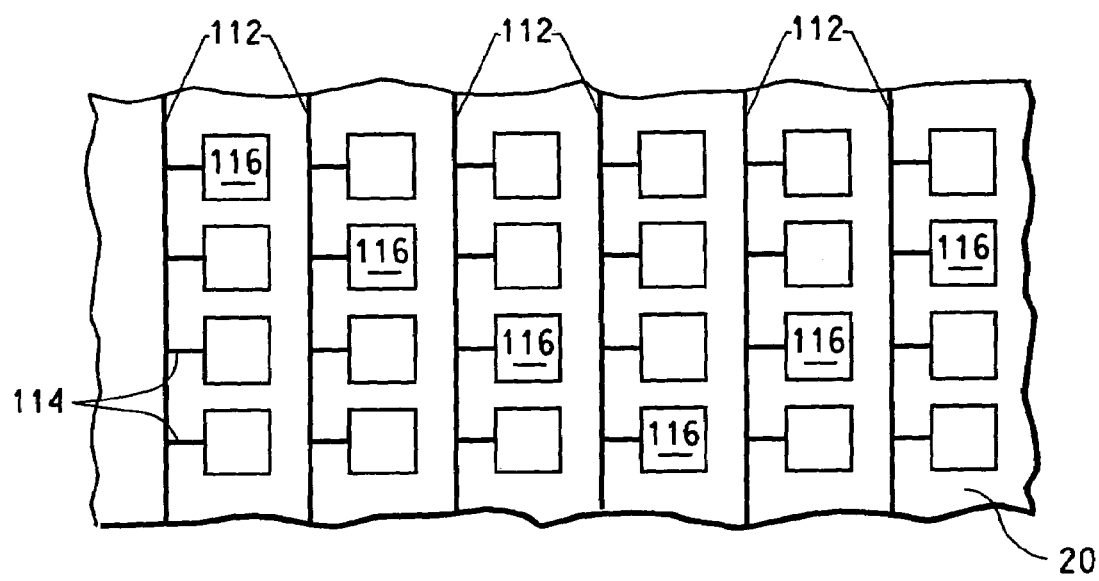
FIGS. 11 to 13 include illustrations of plan views of portions of array after forming conductive members for power transmission lines having windows in accordance with different embodiments.
Figure 12:
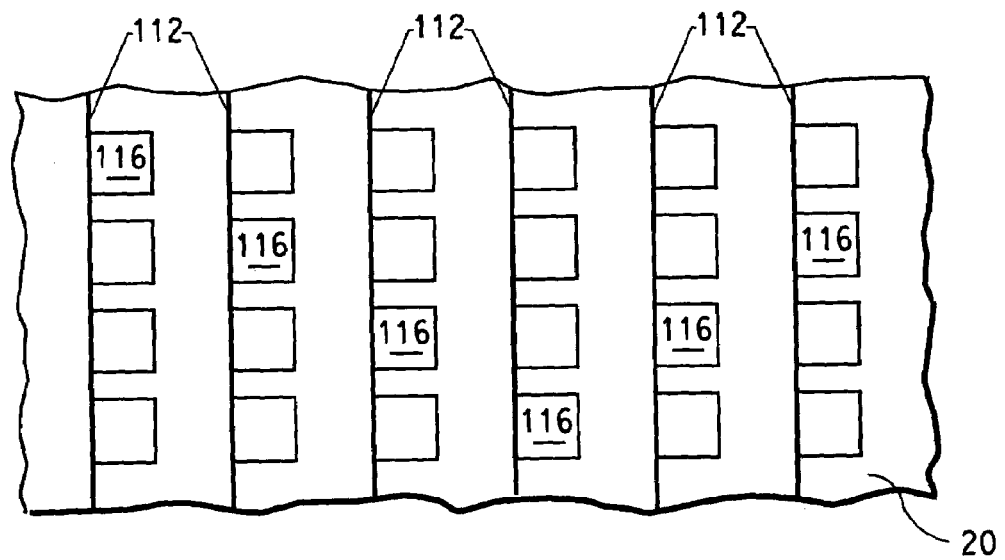
Figure 13:
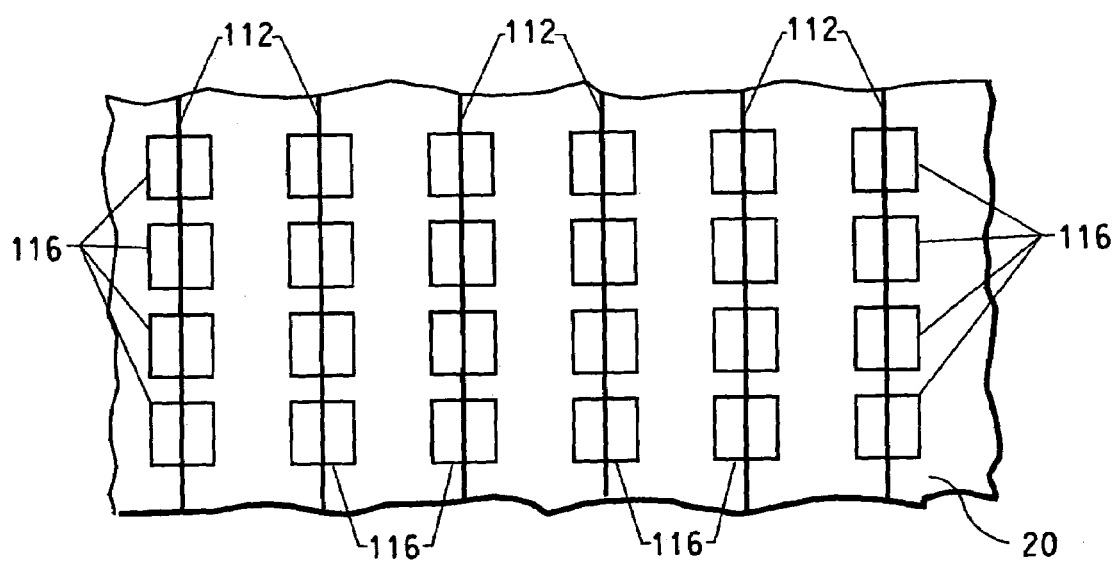

6. Alternative Embodiments for Power Transmission Lines Adjacent to the Substrate FIGS. 11, 12, 13 and 14 includes an alternative embodiment having different shaped conductive members for the power transmission lines and an organic material for conductive members that are first electrodes. Conductive members 112 in FIGS. 11, 12, and 13 are substantially identical to conductive members 22 in FIG. 2 except that the layout is different. Referring to FIG. 11, conductive members 112 are power transmission lines that include taps 114 and have "frames" that define window portions 116. The frames can help to further reduce resistance so that perimeters of the subsequently-formed conductive members are at approximately the same potential (less side-to-side variation). The shape of the window portions 116 is not limited to the rectangles. The openings may have any one or more of the shapes or patterns described with respect to conductive members 72.

FIGS. 12 and 13 include illustrations of other layouts where the taps 114 are not used. In FIG. 12, the window portions 116 abut the conductive members 112. In FIG. 13, the conductive members 112 bisect the window portions 116. After reading this specification, skilled artisans appreciate that other layout designs are possible, and such layout designs can be tailored to specific applications.

Figure 14:
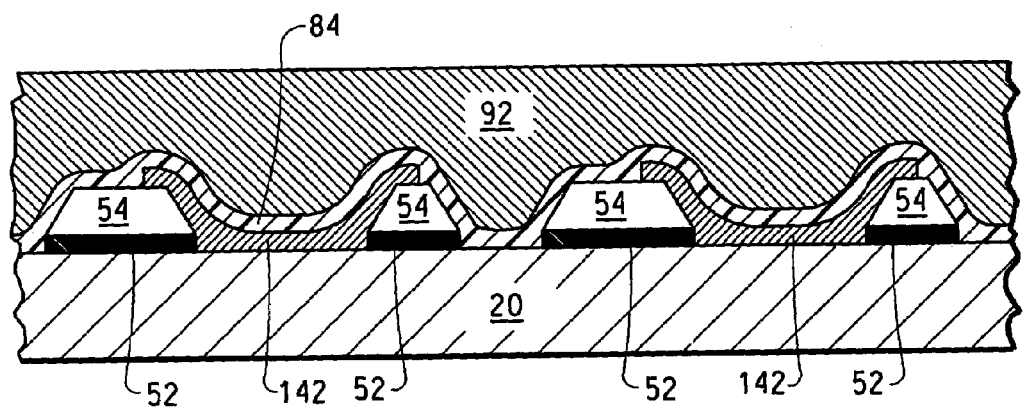
FIG. 14 includes an illustration of a cross-sectional view of the array of FIG. 11 after forming first electrodes, an organic active layer, and a second electrode.

With respect to FIG. 11, conductive members 142 are formed within window portions 116 as illustrated in FIG. 14. The conductive members 142 can include a conductive organic material, such as a sulfonated version of PANI, PEDOT, polypyrrole, or any combination thereof, or an organic charge transfer compound, such as TTF-TCQN and the like. Conductive members 142 may have a resistivity at least two orders of magnitude lower than charge-transport layer 82.

The conductive members 142 can be formed using one or more of any number of different techniques including a conventional coating, casting, printing (continuous printing, ink jet printing, screen printing, etc.), vapor deposition, other deposition process, or any combination thereof. In one embodiment, the window portions 116 may act as a dam, and if printing is used, the conductive members 142 may be deposited as a liquid and retained with the window portions 116. In another embodiment, the conductive members 142 may comprise a photo-imageable or other material. A conventional lithographic technical can be used to selectively expose the layer(s) to light or other radiation and remove unwanted portions with a developer or other etching solution, thereby leaving the conductive members 142. In other embodiments, other removal techniques, such as laser ablation, may be used to remove unwanted portions of the layer(s) to result in the organic conductive members 142. In still another embodiment, the conductive members 142 can be formed as a patterned layer using a stencil mask during coating, depositing, or the like. In this embodiment, the conductive members 142 are in the shape of rectangles and correspond to pixels within an array. The conductive members 142 typically have a thickness in a range of approximately 30 to 500 nm.

The organic active layer 84 and conductive members 92 are formed as previously described. The organic active layer 84 directly contacts the conductive members 142 in this embodiment.

Figure 15:
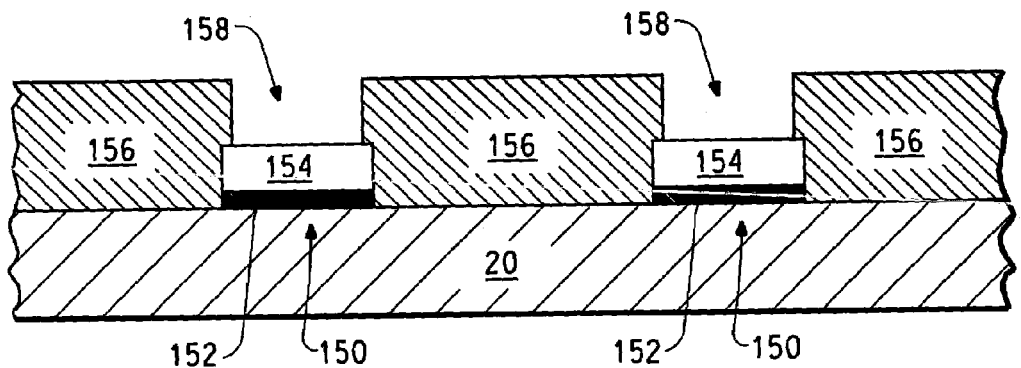
FIG. 15 to 18 include illustrations of cross-sectional and plan views in accordance with an alternative embodiment in which conductive members for power transmission lines are strapped to first electrodes.

FIGS. 15 to 18 include illustrations of an alternative embodiment. Conductive members 150 are formed over the substrate 20 as illustrated in FIG. 15. The conductive members 150 are power transmission lines similar to conductive members 22 previously described. The conductive members 150 include an optional black layer 152 and a conductive layer 154. The conductive members 150 can include materials that are used to form conductive members 22, can be formed using any one or more of the processes used to form the conductive members 22, or a combination thereof. In one embodiment, the conductive members 150 can be significantly thicker than the conductive members 22 because the insulating layer 156 helps to reduce step height concerns. The insulating layer 156 helps to improve planarity before forming conductive members that will be part of the first electrodes. In an alternate embodiment (not illustrated), the conductive members 150 are formed separately from the substrate 20 and are attached to the substrate 20 before forming the insulating layer 156.

An insulating layer 156 is formed over the conductive members 150 and patterned to define openings 158 that expose portions of the conductive members 150. The insulating layer 156 can include nearly any insulating material conventionally used within organic electronic devices. In one embodiment, the insulating layer 156 includes one or more layers of an oxide, a nitride, or a combination thereof. The insulating layer 156 may be formed as a patterned layer (e.g., using a stencil mask) or deposited and subsequently patterned using conventional techniques. The insulating layer 156 is at least as thick as the conductive members 150. In one embodiment, the insulating layer 156 is 0.1 to 10 microns thicker than the conductive members 150.

Figure 16:
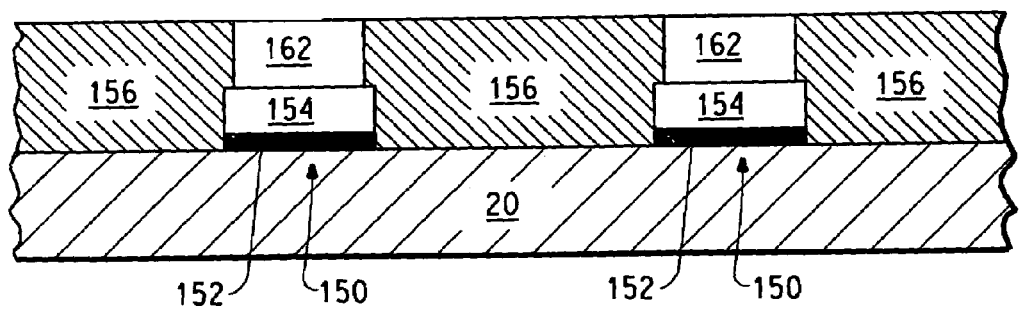

Conductive plugs 162 are formed within the openings 158 in the insulating layer 156 as illustrated in FIG. 16. The conductive plugs 162 can include any one or more of the materials as described for use with the conductive members 22. In one embodiment, a conductive layer can be deposited within the openings 158 and over the insulating layer 156 using a conventional technique. Portions of the conductive layer lying outside the openings 156 can be removed by etching or polishing to form the conductive plugs 162. In another embodiment, a conductive material can be selectively deposited or plated within the openings 158 to form the conductive plugs 162.

Figure 17:
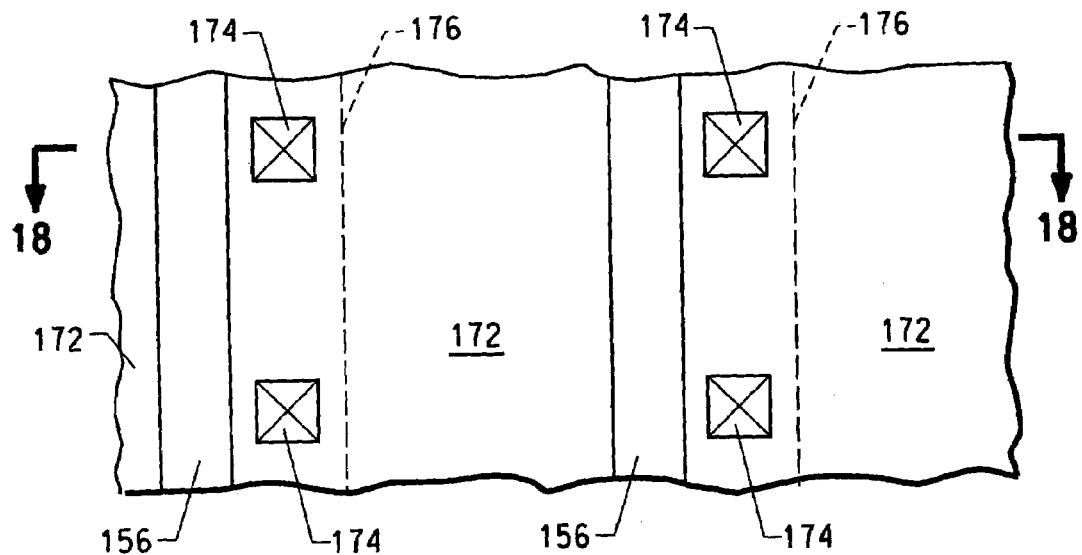
Figure 18:
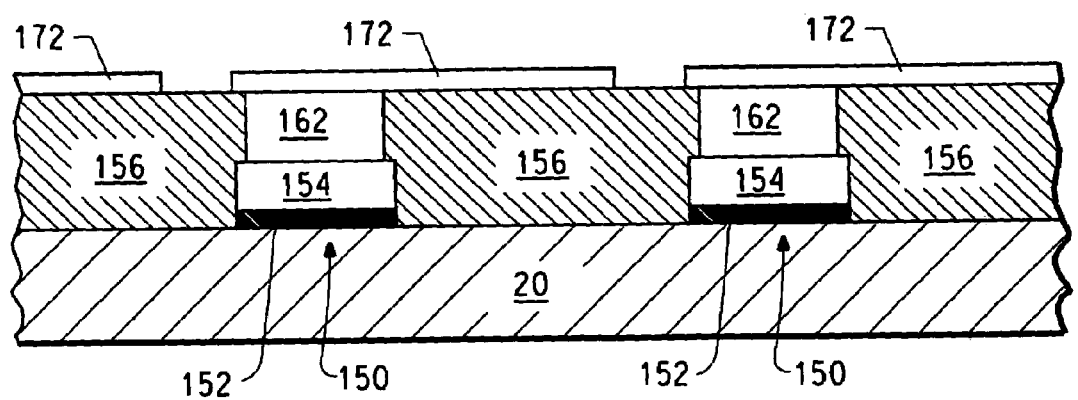

Conductive members 172 are formed over the conductive plugs 162 and insulating layer 156 as illustrated in FIGS. 17 and 18. The conductive members 172 act as first electrodes (e.g., anodes) for the organic electronic device being formed. In the embodiment illustrated, within the array, the conductive members 172 are in the form of strips that are substantially parallel to each other. The x'ed boxes 174 illustrate locations where the conductive members 172 contact the underlying conductive plugs 162. The dashed line 176 corresponds to an edge of the underlying conductive member 150.

The conductive members 172 include one or more layers of the materials and can be formed using any one or more formation techniques previously described for conductive members 72. In one embodiment, the conductive members 172 can transmit at least 70% of the radiation to be emitted or received by a subsequently-formed organic layer. Formation of the remainder of the organic electronic device is substantially the same as previously described in a prior embodiment.

The use of the conductive plugs 162 allows materials to be used within conductive members 172 that are incompatible with the conductive members 150, or vice versa. The conductive plugs 162 physically separate but still provide electrical connections between the conductive members 150 and 172. Such a structure can allow a wider variety of materials to be used within the conductive members 150 and 172 without having to address material incompatibility issues if the conductive members 150 and 172 would physically contact each other.

In another embodiment (not illustrated), the openings 158 and conductive plugs 162 are not used. After forming the insulating layer 156 over the substrate 20 and conductive plugs 162, portions of the insulating layer 156 overlying the conductive members 150 are removed by etching or polishing using a conventional technique. In one specific embodiment, a conventional resist etch-back process can be used. The top surfaces of the conductive members 150 are exposed, and conductive members 172 would contact the top surfaces of the conductive members 150.

Figure 19:
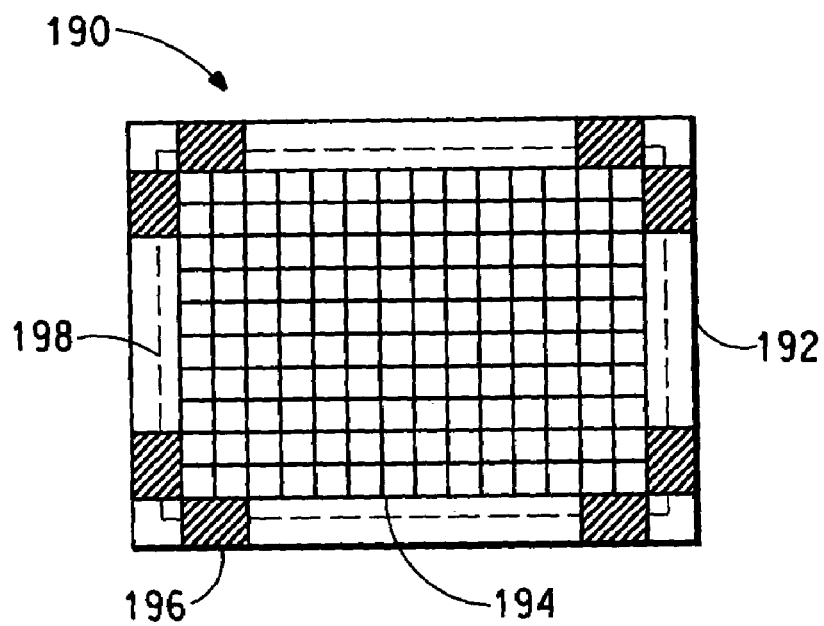
FIG. 19 includes an illustration of a plan view of a flat panel light having conductive member(s) that form a lattice.

FIG. 19 illustrates an embodiment that is useful for a lighting panel 190, potentially sensors, or other applications. The embodiment is similar to the display as illustrated in FIG. 2 except that a lighting panel 190 is being formed. The lighting panel includes a substrate 192. A first conductive member 194 in the shape of a lattice is formed over the substrate 192. The first conductive member 194 can be considered a multiplicity of intersecting power transmission lines. The first conductive member 194 may be formed using any one or more of the materials and formation processes as previously described for the power transmission lines. As seen from a cross-sectional view, the sides of the first conductive member 194 may or may not have sloped slides, and if they do, they may be sloped in either direction (wider near the substrate 192 or narrower near the substrate 192). The black layer (not illustrated, but previously described with other embodiments) may or may not be formed between the substrate 192 and the first conductive member 194. The shape of the openings within the first conductive member 194 is not limited to the squares. The openings within the first conductive member 194 can include nearly any shape or size, such as those previously described with respect to window portions 116.

Electrical connectors 196 are electrically connected to the first conductive member 194. The electrical connectors 196 may be formed using any one or more of the materials and formation processes as previously described for the power transmission lines. In one embodiment, the first conductive member 194 and electrical connectors 196 may be formed at the same time with the same materials. Alternatively, the first conductive member 194 and electrical connectors 196 may be formed with at least one different material, different processing acts, or both. In one embodiment, the electrical connectors 196 are edge connectors.

A second conductive member 198 may be formed using any one or more of the materials and formation processes as previously described for the conductive members 72 or 142. The sides of the second conductive member 198 correspond to the dashed line as illustrated in FIG. 19. Note that the electrical connectors 196 extend beyond the sides of the second conductive member 198. An organic active layer, second conductive member(s), and other layers or structures may be formed to complete the fabrication of the organic electronic device as previously described. When activated, substantially all of the array emits lights, as opposed to a pixel-by-pixel activation as would be seen with a display.

In still another embodiment, the order of forming the first conductive members 22, 112, or 194 and the second conductive members 72, 142, or 198 may be reversed.

7. Alternative Embodiments for Power Transmission Lines Adjacent to the Lid

Figure 20:
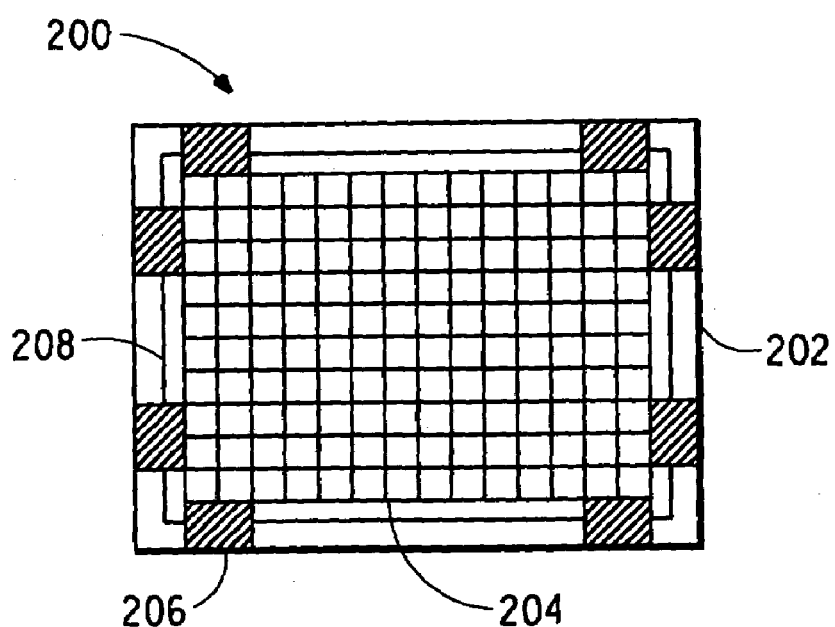
FIGS. 20 to 22 include illustrations of plan and cross-sectional views of a portion of an encapsulating assembly having a conductive member in the shape of a lattice that can be used for as a power transmission line.

In another alternative embodiment, the concepts as previously described can be applied to a conductive member used with a lid, wherein the conductive member makes electrical contact to a common cathode that could be used in an active matrix ("AM") OLED display. FIG. 20 includes an illustration of a bottom view of an encapsulating assembly 200 that may be used in an AM OLED display. The bottom view represents the encapsulating assembly 200 as it would be seen from the perspective of a substrate to which it is to be attached. In one embodiment, the encapsulating assembly 200 includes a lid 202 and a conductive member 204 attached to the lid 202. The conductive member 204 is shaped as a lattice. The conductive member 204 can be considered a multiplicity of intersecting power transmission lines. In another embodiment, the conductive member 204 may be replaced by a plurality of conductive members that are oriented in substantially parallel to one another, such as between rows or columns of radiation-emitting or radiation-responsive components within the array.

The lid 202 has an inner edge 208 and electrical connectors 206 that extend from the conductive member 204 to locations the outside of the lid 202. The electrical connectors 206 allow one or more electrical connections to be made to the conductive member 204 from a point outside the lid 202. In one embodiment, the lid 202 allows at least 70% of the radiation to be transmitted to or from a substrate to which it will be attached. In another embodiment, the lid 202 does not allow a significant amount of radiation to be transmitted through it.

The conductive member 204 and electrical connectors 206 may be formed using any one or more of the materials and formation processes as previously described for power transmission lines. In one embodiment, the first conductive member 204 and electrical connectors 206 may be formed at the same time with the same materials. Alternatively, the first conductive member 204 and electrical connectors 206 may be formed with at least one different material, different processing acts, or both. In one embodiment, the electrical connectors 206 are edge connectors.

In one embodiment, the conductive member 204, the electrical connectors 206, or both may be fabricated separately from the lid 202 and be attached to the lid 202 before joining the encapsulating assembly 200 to the substrate 20. In another embodiment, the conductive member 204, electrical connectors 206, or both, may be formed (e.g., printed or otherwise deposited) onto the lid 202.

Figure 21:
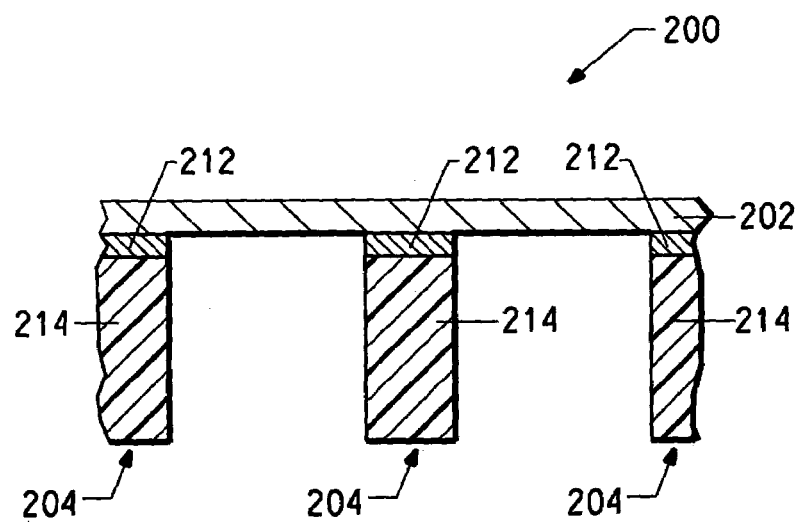

FIG. 21 includes an illustration of a cross-sectional view of a portion of the encapsulating assembly 200. The sides of the conductive member 204 may or may not have sloped slides, and if conductive member 204 has sloped sides, they may be sloped in either direction (wider near the lid 202 or narrower near the lid 202). The shape of the openings within the conductive member 204 is not limited to the squares. The openings within the conductive member 204 can include nearly any shape or size, such as those previously described with respect to window portions 116.

The conductive member 204 includes an optional layer 212 and a conductive layer 214. In one embodiment, the optional layer 212 and the conductive layer 214 are similar to the black layer 52 and conductive layer 54 as described with respect to a prior embodiment. In another embodiment, the optional layer 212 includes a compressive or shock absorbing material. In still another embodiment, the optional layer 212 includes an adhesive material including, for example, one or more epoxy, organic silicone, or any combination thereof. In a further embodiment, the optional layer 212 may include any combination of the properties described above (an adhesive compound that includes carbon and allows for a significant amount of compression). In another embodiment, the optional layer 212 may be omitted and the conductive layer 214 contacts the lid.

The conductive layer 214 may be formed using any one or more of the materials and formation processes as previously described for the power transmission lines. The conductive layer 214 may include one or more materials, layers, or both. The conductive layer 214 will subsequently form part of an electrical contact to a conductive member of the organic electronic device.

In one specific embodiment, the conductive layer 214 may comprise a low melting point metal or metal alloy. The metal or metal alloy may comprise In, Sn, Bi, Pb, Hg, Ga, Cd, any alloy of such metals, or any combination thereof. The metal or metal alloy may have a melting point greater than 85° C. because the organic electronic device may be subjected to tests as high as 85° C. The metal or metal alloy may have a melting point less than 240° C. to reduce the likelihood of damage to an organic layer within the organic electronic device when the metal or metal alloy is melted. A melting point in a range of 130° C. to 150° C. may be used in one embodiment. In such an embodiment, alloys of In, Sn, and Pb may have eutectic temperatures in the range of 130-150° C.

In another embodiment, the conductive layer 214 may include a first layer of a highly conductive metal or metal alloy that has a melting point higher than 240° C. (e.g., Al, Au, Cu, or the like) closer to the lid 202, and a second layer of one of the relatively low melting point metal(s) or alloy(s) having a melting point lower than 240° C. further from the lid 202. The second layer can effectively act as a solder during a subsequent joining operation.

In still another embodiment, the conductive layer 214 may include a metal-containing paste. In a specific embodiment, the metal-containing paste is a silver epoxy, and the optional layer 212 is not present.

Figure 22:
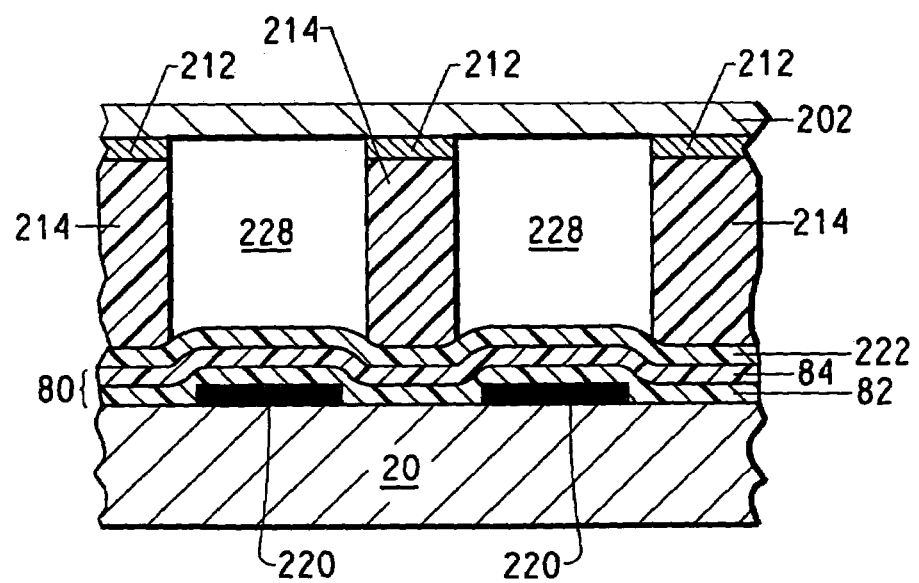

Referring to FIG. 22, the encapsulating assembly 200, including the lid 202 is joined to a substrate 20. In one embodiment, the substrate 20 includes driving circuits (not illustrated in FIG. 22) that are electrically connected to first electrodes 220. Before joining, first electrodes 220, the organic layer 80, and one or more second electrode 222 are formed over the substrate 20. The first and second electrodes 220 and 222 can include any materials and be formed using any conventional techniques used for forming anodes and cathodes for organic electronic devices. In one embodiment, the organic electronic device includes an AM OLED display, and the second electrode 222 is a common cathode for the AM OLED array. The second electrode 222 is sufficiently thin such at least 70% of the radiation incident on the second electrode 222 is transmitted though it. The second electrode 222, by itself, may be too resistive to allow proper current flow through electronic components (e.g., OLEDs) within the array of the organic electronic device.

The encapsulating assembly 200 is attached to the substrate 20 at location(s) outside the AM OLED array (not illustrated in FIG. 22). The conductive member 204 is aligned to contact and be electrically connected to the second electrode 222 when the encapsulating assembly 222 is joined with the substrate 20 (at locations not illustrated in FIG. 22). The conductive member 204 substantially lowers the resistance to allow high current to be used with the organic electronic device and still allows emission or reception of radiation by the organic active layer 84. Gaps 228 between portions of the conductive member 204 are under vacuum, include at least one inert gas (nitrogen, helium, argon, etc.), or a combination thereof.

The process used to join the encapsulating assembly 200 to the substrate 20 are highly varied depending on the materials used for lid 202, conductive member 204, second electrode 222, and substrate 20. Many of the processes are conventional, and after reading this specification, skilled artisans will be able to select a process that matches their needs or desires. A few specific embodiments are described to illustrate just some of the many possible embodiments.

In one embodiment, the optional layer 212 includes a compressive or shock absorbing material. The encapsulating assembly 200 (the lid 202 more specifically) is attached to the substrate 20 outside the array, and the optional layer 212 is at least slightly compressed during the joining operation. The optional layer 212 helps to generate pressure that keeps the conductive layer 214 in contact with the second electrode 222, so that good electrical contact is made between the conductive layer 214 and the second electrode 222.

In another embodiment, the conductive layer 214 has the first and second layers as previously described. The second layer, which would be closer to the second electrode 222 as compared to the first layer, effectively is a solder material. After the encapsulating assembly 200 is aligned to the electronic components on or within the substrate 20 or to the substrate 20 itself, the second layer of the conductive layer 214 is taken to a temperature sufficient to melt the second layer. In one specific embodiment, the temperature of the second layer is taken to a temperature in a range of approximately 85 to 240° C., and in another more specific embodiment, to a temperature in a range of 135 to 150° C. In one embodiment, the time at this elevated temperature is relatively short (e.g., less than a minute) to reduce damage to the organic layer 80. The second layer may be heated using a laser or other method that is capable of providing heating energy locally to the second layer. The melting fuses the second layer to the second electrode 222, thereby forming an electrical connection between the second electrode 222 and the first layer of the conductive layer 214. The optional layer 212 can be used but is not required for this embodiment.

In still another embodiment, the conductive member 204 may include a metal-containing paste, such as silver epoxy, as the conductive layer 214. If desired, the silver epoxy may include carbon to darken the color of the silver paste. The encapsulating assembly 200 is joined with the substrate 20, such that the conductive layer 214 contacts the second electrode 222. The conductive layer 214 may or may not be conductive at the time it first contacts the second electrode 222. The conductive layer 214 is allowed to cure, and upon curing, the conductive layer 214 becomes conductive if it was not yet conductive. In one embodiment, curing can be performed by heating the joined assembly to remove at least some of organic material that may be present within the conductive layer 214. The optional layer 212 can be used but is not required for this embodiment.

In yet another embodiment, the conductive member 204 and electrical connectors 206 are fabricated separately from the lid 202 and the substrate 20. The conductive member 204, electrical connectors 206, lid 202, and substrate 20 are aligned, and the lid 202 is subsequently joined to the substrate 20. In another similar embodiment, the optional layer 212 includes an adhesive. The lid 202 is joined to the substrate 20 and the conductive layer 214 via the optional layer 212.

Figure 23:
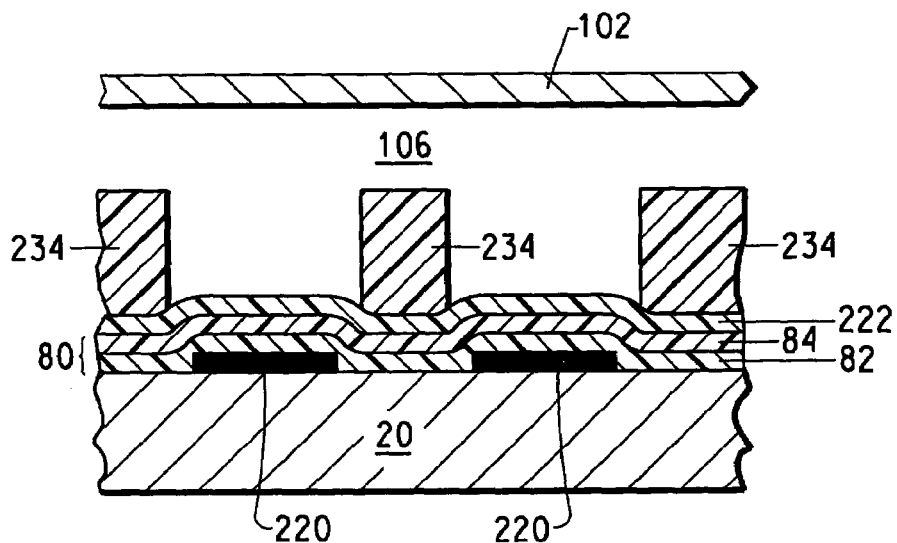
FIG. 23 includes an illustration of a cross-sectional view in accordance with an alternative embodiment in which conductive members for power transmission lines are electrically connected to second electrodes.
Figure 24:
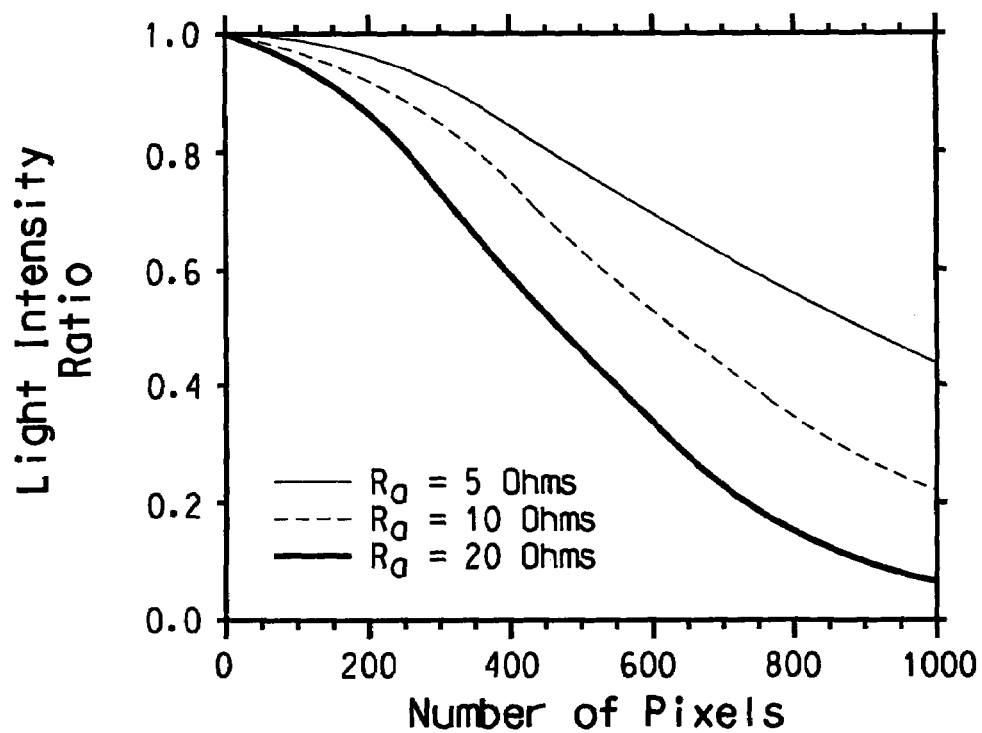
FIG. 24 includes a plot of number of pixels versus light intensity ratio for different levels of resistance.

FIG. 23 includes an illustration depicting yet another embodiment. One or more conductive members 234 are formed over the second electrode 222 before the lid 102 is attached to the substrate 20. In one embodiment, the conductive members 234 are oriented to lie between columns of radiation-emitting or radiation-responsive components within the array. In another embodiment, the conductive member 234 is shaped as a lattice. Note that the conductive member(s) 234 are located in a position where it does not (they do not) substantially interfere with radiation to be emitted or received by the organic layer 80.

The conductive member(s) 234 can include any of the materials and be formed using any of the processes previously described with respect to the conductive member 204. However, in one embodiment, unlike conductive member 204, the conductive member(s) 234 does not (do not) contact the lid 106 at a location spaced apart from the substrate 20 (i.e., does not contact the bottom of the lid 106 as illustrated in FIG. 23). The conductive member(s) 234 can be formed over the substrate 20 or formed separately and subsequently joined to the second electrode 222 before or at the time the lid 106 is joined to the substrate 20. Similar to the embodiment using the conductive member 204, many options are available.

In a further embodiment, the power transmission lines adjacent to the lid may make contacts to contact pads overlying the substrate. Ser. No. 11/025,110, entitled "Electronic Devices Comprising Conductive Members That Connect Electrodes to Other Conductive Members Within a Substrate and Processes for Forming the Electronic Devices" by Yu et al., filed simultaneously herewith provides details for forming electronic devices that have such contact pads. After reading this specification and the recited document, one of ordinary skill in the art will appreciate how to integrate the teachings herein with the structures and processes described in the recited document.

8. Other Embodiments

The embodiments described above are well suited for AM and PM OLED displays including monochromatic and full color displays. Still, the concepts described herein can be used for other types of radiation-emitting electronic components. In one embodiment, the radiation-emitting electronic components may emit radiation within the visible light spectrum, and in another embodiment, the radiation-emitting electronic component may emit radiation outside the visible light spectrum (e.g., UV or IR).

In another embodiment, the concepts described herein may be extended to other types of organic electronic devices. In one embodiment, a sensor array may include an array of radiation-responsive electronic components. In one embodiment, different radiation-responsive electronic components may have the same or different active materials. The response of those active materials may change over time. Further, some of the sensor array may have different portions that receive different wavelengths, different radiation intensities, or a combination thereof. Similar to an electronic device with radiation-emitting electronic components, the lifetime of an organic electronic device with radiation-responsive electronic components may have a longer useful life.

In still another embodiment, the first and second electrodes within the organic electronic device can be reversed. In such an embodiment, the second electrodes (e.g., cathodes) will be closer to the substrate as compared to the first electrodes (e.g., anodes). After reading this specification, skilled artisans will appreciate how to modify processes and organic electronic devices in order to take advantage of the teachings herein.

9. Advantages

Embodiments described above allow thin, relatively thin, transparent conductive members to be used as electrodes. Other members that are power transmission lines are connected to the conductive members that are electrodes to keep resistance low, which in turn allows for more uniformity of emission or reception characteristics of radiation-emitting or radiation-responsive components along the length of a power transmission line. Because, in some embodiments, little, if any, portions of the power transmission lines lie within the radiation-emitting or radiation-responsive regions as seen by a user, the power transmission lines do not block substantial portion of the radiation being emitted from or received by the radiation-emitting or radiation-responsive regions.

The use of power transmission lines more readily allows flexible substrates to be used. Many materials, and particularly metals, can be bent or flexed on a flexible substrate without breaking. Compare to ITO, IZO, and other oxide and nitrides that may be brittle and crack when bent or flexed. The likelihood of electrical opens or high resistance paths are substantially lessened when materials used for the power transmission lines are ductile, malleable, or both. Even if ITO or IZO are used with the power transmission lines, the ITO or IZO pads in some embodiments are relatively small compared to lengths of the power transmission lines. Also, the ITO or IZO pads do not need to extend across substantially all of a dimension of the array. Therefore, use of at least one of the embodiments provides sufficient flexibility for the flexible substrate under normal operating conditions. Put in simple terms, an organic electronic device fabricated on a flexible substrate can now be flexed.

Also, the embodiments may be used in high current applications, such as outdoor displays and flat panel lights. After biasing the first and second electrodes of radiation-emitting component(s), the array may have a radiation emission intensity of 1100 $cd/m^2$ and higher. For flat panel lights, the emission intensity may be in a range of approximately 2000 to 5000 $cd/m^2$. A conventional transparent electrode (not including a power transmission line as described herein) cannot withstand the current requirements for any significant period of time and would fail. The power transmission lines allow transparent electrodes to still be used but most of the current flows through the power transmission line.

The power transmission lines can have curved or sloped sides. The curved or sloped sidewalls help to reduce the "waveguide effect" as radiation passes along an organic active layer of radiation-emitting components. If the sides are nearly perpendicular, radiation may be reflected side to side, thereby increasing the transmission of radiation laterally along the organic active layer and potentially other layers and manifesting itself as optical cross talk. The curved or slopes sides help to reflect radiation back towards the second electrode and less in lateral directions. Therefore, optical cross talk between adjacent pixels in a display is reduced. Note that the curved or sloped sides of the power transmission lines may not be required in some applications, such as flat panel lights, detectors, and voltaic cells.

The power transmission lines may include or overlie a black layer. The black layer can be part of a black matrix to improve contrast of the array, particularly when the array is part of a display. Without the black layer, the power transmission lines, especially metal power transmission lines, may be highly reflective. Additionally, the black layer may include an adhesion layer that is also conductive (e.g., a metal) and an antireflective layer (e.g., a metal nitride, a metal silicon nitride, a metal oxide, or any combination thereof.

The power transmission lines can be integrated into the layout without causing a significant increase in the area of an array. The power transmission lines may be formed at the same time as conductive members for the peripheral or remote circuitry within the organic electronic device. Therefore, additional process sequences may be avoided.

Many options are available for the integration of the power transmission lines into the organic electronic device. The conductive members for the power transmission lines can be buried within the substrate, formed at about the same elevation as first electrodes for radiation-emitting or radiation-responsive components, formed over the second electrode(s) for such components, formed within a lid of an encapsulation assembly, or formed separately from the substrate or the lid. The conductive members for the power transmission lines can be electrically connected to the first or second electrodes by contact, via conductive plugs, fusing (soldering), attachment using an adhesive compound, potentially other methods, and combinations thereof. Such alternatives allow many potential designs that can be optimized for any one or more of performance, reliability, ease of manufacturing, cost, etc.

EXAMPLES

The invention will be further described in the following examples, which do not limit the scope of the invention described in the claims.

Example 1

Example 1 demonstrates that a radiation-emitting component having an organic conductive member as an electrode has radiation emitting and electrical characteristics similar to a conventional device having a transparent ITO electrode.

A thin metal layer, such $CrO_x/Cr$ approximately 150 nm, is coated on transparent substrates, such as glass or polyethylene film with $3 \times 3$ $cm^2$ nominal dimensions. A metal power transmission line may include Ni, Cu, Al, Au, Ag, W, Ta, or a combination thereof and can be deposited on a substrate and provide good electric conductivity. The $CrO_x$ is used as black matrix to achieve a high contrast ratio. The metal power transmission lines can be processed to have windows for the radiation to pass by chemical etching or stencil mask deposition. A conducting polymer layer, such as PEDOT, PANI, polypyrrole, etc., with approximately 100 nm thickness is coated over the substrate and acts as the first electrode (i.e., anode) for PLED pixels. In this example, Bayer's Baytron 4037 (a specific type of PEDOT) is used. A light emitting polymer, such as Covion's SY (a specific type of poly(phenylenevinylene)) approximately 70 nm thick is coated, and then approximately 3 nm Ba and approximately 500 nm Al layers are coated as the second electrode (i.e., cathode). At over two volts DC bias, the radiation-emitting component emits yellow light just like one using ITO as the first electrode. The efficiency is about 6 cd/A, which is comparable to that of the conventional ITO/PEDOT/SY/Ba/Al structure.

Example 2

Example 2 demonstrates that devices can be formed to yield luminescence values similar to those predicted by theoretical calculations.

For a practical application of 10 cm (4 inch) nominal OLED AM display panel with 320×240 pixels, the line resistance between adjacent pixels of a metal power transmission line is around 10 Ω. At luminance level approximately 200 $cd/m^2$, a single pixel's current is about 1.5 µA, and its operation voltage is approximately 8 V. Therefore, the coefficient $C_1$ is roughly $1.87 \times 10^{-7}$ A/V. Using those numbers, a calculation indicates the last pixel's luminance is approximately 83% of that of the first pixel. The experiment measurements are about 80%. The theoretical calculation is consistent with the experiments. By reducing the metal line resistance to 5 Ω, the luminance ratio of the last pixel to the first pixel is improved to more than 90%, consistent with the theoretical predications. FIG. 23 illustrates the light intensity ratio versus the number of pixels for different resistances ($R_a$) of metal power transmission lines.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

What is claimed is:

1. An organic electronic device including electronic components within an array, wherein the organic electronic device comprises:
    a flexible substrate;
    a first conductive member overlying the substrate and lying at least partly within the array, wherein the first conductive member is at least part of a first power transmission line; and
    a second conductive member overlying the substrate and lying at least partly within the array, wherein:
        the second conductive member is at least part of a first electrode and is electrically connected to the first conductive member;
        the first conductive member consists essentially of a first metal selected from Ni, Cu, Al, Au, Ag, W and Ta;
        the second conductive member has at least a portion that overlies or underlies substantially all of a radiation-emitting or radiation-responsive region of at least one of the electronic components within the array; the second conductive member comprises an organic material and
        the first conductive member does not have a portion that overlies or underlies substantially all of the radiation-emitting or radiation-responsive region for any electronic component within the array.

2. The organic electronic device of claim 1, wherein the first metal of the first conductive member is selected from a metal, mixed metal, alloy, metal oxide, metal nitride or a combination thereof.

3. The organic electronic device of claim 1, wherein:
    the first conductive member comprises a first material;
    the second conductive member comprises a second material different from the first material; and
    the second material has a resistivity at least ten times higher than the first material.

4. The organic electronic device of claim 1, further comprising a buffer layer, a charge-blocking layer, a charge-injection layer, a charge-transport layer, or a combination thereof, wherein the first conductive member comprises a first metal and the second conductive member comprises a second metal different from the first metal.

5. The organic electronic device of claim 1, wherein:
    the first conductive member includes a window portion; and
    from a plan view of the array, the window portion surrounds the radiation-emitting or radiation-receiving region of at least one electronic component within the array.

6. The organic electronic device of claim 1, wherein the organic electronic device is designed to be an outdoor display or a lighting panel.

7. The organic electronic device of claim 1, further comprising third conductive members substantially identical to the second conductive member and electrically connected to the first power transmission line, wherein the second and third conductive members are spaced apart from one another.

8. The organic electronic device of the claim 7, wherein the first power transmission line extends across substantially all of a dimension of the array.

9. The organic electronic device of claim 1, further comprising an organic active layer.

10. The organic electronic device of claim 9, further comprising third conductive members substantially identical to the first conductive member, wherein the third conductive members are at least part of a second power transmission line, and from a plan view, the first and second power transmission lines are substantially parallel to one another within the array.

11. The organic electronic device of claim 10, wherein each of the first and third conductive members lies closer to the substrate compared to the organic active layer.

12. The organic electronic device of claim 10, further comprising a lid, wherein each of the first and third conductive members lies closer to the lid compared to the organic active layer.

13. The organic electronic device of claim 1, wherein the first member is shaped as a lattice.

14. An organic electronic device including electronic components within an array, wherein the organic electronic device comprises:
    a substrate;
    a first conductive member overlying the substrate and lying at least partly within the array, wherein the first conductive member is at least part of a first power transmission line; and
    a second conductive member overlying the substrate and lying at least partly within the array, wherein:
        the second conductive member is at least part of a first electrode and is electrically connected to the first conductive member;
        the first conductive member consists essentially of a first metal selected from Ni, Cu, Al, Au, Ag, W and Ta;
        the second conductive member has at least a portion that overlies or underlies substantially all of a radiation-emitting or radiation-responsive region of at least one of the electronic components within the array; the second conductive member comprises an organic material and the first conductive member does not have a portion that overlies or underlies substantially all of the radiation-emitting or radiation-responsive region for any electronic component within the array.

15. The organic electronic device of claim 14, wherein the first metal of the first conductive member is selected from a metal, mixed metal, alloy, metal oxide, metal nitride or a combination thereof.

16. The organic electronic device of claim 14, wherein:
the first conductive member comprises a first material;
the second conductive member comprises a second material different from the first material; and
the second material has a resistivity at least ten times higher than the first material.

17. The organic electronic device of claim 14, further comprising an organic active layer.

18. The organic electronic device of claim 17, further comprising third conductive members substantially identical to the first conductive member, wherein the third conductive members are at least part of a second power transmission line, and from a plan view, the first and second power transmission lines are substantially parallel to one another within the array.

19. The organic electronic device of claim 18, wherein each of the first and third conductive members lies closer to the substrate compared to the organic active layer.

20. The organic electronic device of claim 18, further comprising a lid, wherein each of the first and third conductive members lies closer to the lid compared to the organic active layer.

* * * * *